(12) United States Patent
Sugizaki

(10) Patent No.: US 8,846,521 B2
(45) Date of Patent: Sep. 30, 2014

(54) METHOD FOR MANUFACTURING AN ELECTRONIC COMPONENT PACKAGE AND ELECTRONIC COMPONENT PACKAGE

(75) Inventor: Yoshiaki Sugizaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 911 days.

(21) Appl. No.: 12/238,679

(22) Filed: Sep. 26, 2008

(65) Prior Publication Data

US 2009/0085205 A1 Apr. 2, 2009

(30) Foreign Application Priority Data

Sep. 28, 2007 (JP) .................. P2007-256189

(51) Int. Cl.
| | |
|---|---|
| *B81B 7/00* | (2006.01) |
| *H01L 23/00* | (2006.01) |
| *H01L 23/498* | (2006.01) |
| *H01L 21/56* | (2006.01) |
| *H01L 23/31* | (2006.01) |

(52) U.S. Cl.
CPC ..... *H01L 21/561* (2013.01); *H01L 2924/01005* (2013.01); *H01L 2924/01079* (2013.01); *H01L 2924/01006* (2013.01); *H01L 2224/16225* (2013.01); *H01L 2924/15311* (2013.01); *B81B 2207/098* (2013.01); *H01L 2924/01078* (2013.01); *H01L 2224/02319* (2013.01); *H01L 2224/04105* (2013.01); *H01L 2924/30107* (2013.01); *H01L 23/3114* (2013.01); *H01L 2224/32145* (2013.01); *H01L 2924/14* (2013.01); *H01L 2224/16145* (2013.01); *B81B 7/007* (2013.01); *H01L 2225/06506* (2013.01); *H01L 2224/04042* (2013.01); *H01L 2224/32225* (2013.01); *H01L 24/18* (2013.01); *H01L 2924/01046* (2013.01); *H01L 2224/18* (2013.01); *H01L 23/49811* (2013.01); *H01L 2924/01033* (2013.01); *H01L 24/82* (2013.01); *H01L 2224/73265* (2013.01); *H01L 2924/01019* (2013.01); *H01L 2224/48145* (2013.01); *H01L 2924/30105* (2013.01); *H01L 2225/06568* (2013.01); *H01L 2224/73204* (2013.01); *H01L 2924/01029* (2013.01)
USPC .................. 438/615; 438/25; 438/26; 438/51; 438/55; 438/106

(58) Field of Classification Search
CPC ............................. H01L 24/00; B23K 20/004
USPC ......................................................... 438/615
See application file for complete search history.

(56) References Cited

U.S. PATENT DOCUMENTS 6,107,682 A * 8/2000 Fjelstad ..................... 257/693
6,268,662 B1 * 7/2001 Test et al. ..................... 257/784
(Continued)

FOREIGN PATENT DOCUMENTS

| JP | 11-145323 | 5/1999 |
| JP | 3970849 | 6/2007 |

OTHER PUBLICATIONS

U.S. Appl. No. 12/706,366, filed Feb. 16, 2010, Sugizaki.

*Primary Examiner* — Julio J Maldonado
*Assistant Examiner* — Mohammad Choudhry
(74) *Attorney, Agent, or Firm* — Oblon, Spivak, McClelland, Maier & Neustadt, L.L.P.

(57) ABSTRACT

A manufacturing method of an electronic component package, includes: forming electrode pads on a main surface of a first electronic component; forming first bonding wires shaped in loop so as to be electrically connected with the electrode pads and elongated upward from the electrode pads and such that both ends of the first bonding wires are on the electrode pad, respectively; forming a resin layer over the main surface of the first electronic component so as to embed the first bonding wires; removing the resin layer so as to expose ends of the first bonding wires from the resin layer and removing the end of each of the first bonding wires so that two wires are elongated from on each of the electrode pads; and forming a metallic layer on the surface of the resin layer after removing so that the first bonding wires are electrically connected with the metallic layer.

14 Claims, 38 Drawing Sheets

(56) References Cited

U.S. PATENT DOCUMENTS

| | | |
|---|---|---|
| 6,808,962 B2 | 10/2004 | Tsubosaki |
| 6,818,550 B2 | 11/2004 | Shibata |
| 6,835,898 B2 * | 12/2004 | Eldridge et al. ............... 174/267 |
| 6,930,364 B2 * | 8/2005 | Bruner .......................... 257/414 |
| 2005/0133928 A1 * | 6/2005 | Howard et al. ............... 257/773 |

* cited by examiner

METHOD FOR MANUFACTURING AN ELECTRONIC COMPONENT PACKAGE AND ELECTRONIC COMPONENT PACKAGE

CROSS-REFERENCE TO RELATED APPLICATIONS

This application is based upon and claims the benefit of priority from the prior Japanese Patent Application No. 2007-256189 filed on Sep. 28, 2007; the entire contents which are incorporated herein by reference.

BACKGROUND OF THE INVENTION

Conventionally, wafer level packaging technique such as Chip Scale Package (hereinafter, called as "CSP") has been proposed. In the wafer level packaging technique, a resin for protecting the surface of each semiconductor chip is applied on a semiconductor wafer and the electrode pads for each semiconductor chip are also provided on the semiconductor wafer so as to form a semiconductor wafer assembly. Then, the semiconductor wafer assembly is divided into semiconductor electronic component packages. Concretely, a first insulating film is formed on a semiconductor wafer with electrode pads thereon so that the electrode pads can be exposed. Then, a redistribution layer is formed and a second insulating layer is formed. Then, mounting pads are formed on the second insulating layer so as to be electrically connected with the redistribution layer through the opening of the second insulating layer, and solder balls are formed on the mounting pads, respectively. Then, the thus obtained semiconductor wafer assembly is divided into semiconductor electronic component packages (JP-B 3970849 (PATENT)).

However, the above-described wafer level packaging technique requires photolithography technique in the exposure of the electrode pads through the first insulating layer, the patterning of the redistribution layer and the formation of the mounting pads through the opening of the second insulating layer. In other words, in order to electrically connect the electrode pads of each semiconductor chip (each electronic component) and the mounting pads, respectively, it is required to partially remove the first insulating layer and the second insulating layer between the electrode pads and the mounting pads.

In this point of view, if some convex-concave portions are formed on the semiconductor wafer, the resist layer can not formed uniformly so that the developing can not be carried out uniformly through the resist layer. As a result, the photolithography can not be carried out under good condition and thus, the intended electronic component packages can not be obtained.

BRIEF SUMMARY OF THE INVENTION

An aspect of the present invention relates to a method for manufacturing an electronic component package, including: forming electrode pads on a main surface of a first electronic component; forming first bonding wires shaped in loop so as to be electrically connected with the electrode pads and elongated upward from the electrode pads and such that both ends of the first bonding wires are on the electrode pad, respectively; forming a resin layer over the main surface of the first electronic component so as to embed the first bonding wires; removing the resin layer so as to expose ends of the first bonding wires from the resin layer and removing the end of each of the first bonding wires so that two wires are elongated from on each of the electrode pads; and forming a metallic layer on the surface of the resin layer after removing so that the first bonding wires are electrically connected with the metallic layer.

Another aspect of the present invention relates to a method for manufacturing an electronic component package, including: forming electrode pads on a main surface of a first electronic component; forming first bonding wires shaped in loop and elongated upward by bridging each of the first bonding wires between ones of the electrode pads; forming a resin layer over the main surface of the first electronic component so as to embed the first bonding wires; removing the resin layer so as to expose ends of the first bonding wires from the resin layer and removing the end of each of the first bonding wires so that one wire can be elongated from on each of the electrode pads; and forming and patterning a metallic layer on the surface of the resin layer after grinding which contains a top of the one wire so that the first bonding wires are electrically connected with the metallic layer.

Still another aspect of the present invention relates to an electronic component package, including: a first electronic component with electrode pads provided on a main surface thereof; a resin layer formed on the first electronic component; a metallic layer formed on the resin layer; and bonding wires provided in the resin layer and electrically connecting the electrode pads and the metallic layer so that two wires are elongated upward from one of the electrode pads.

DETAILED DESCRIPTION OF THE INVENTION

Figure 1A:
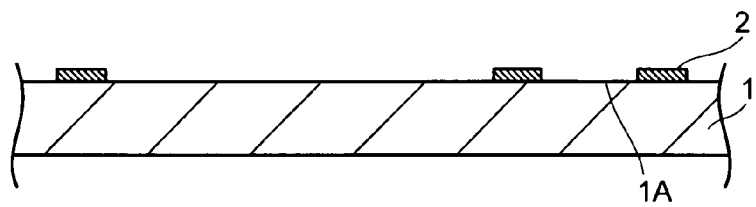
FIGS. 1 and 2 relates to steps in a method for manufacturing an electronic component package according to a first embodiment.

Then, some embodiments will be described with reference to the drawings. Like or corresponding components will be designated by the same reference numerals throughout the drawings.

First Embodiment

FIGS. 1 and 2 relate to steps in a method for manufacturing an electronic component package according to a first embodiment.

Figure 1B:
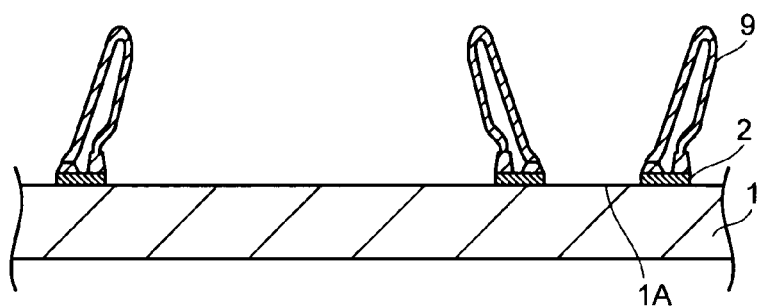
Figure 1C:
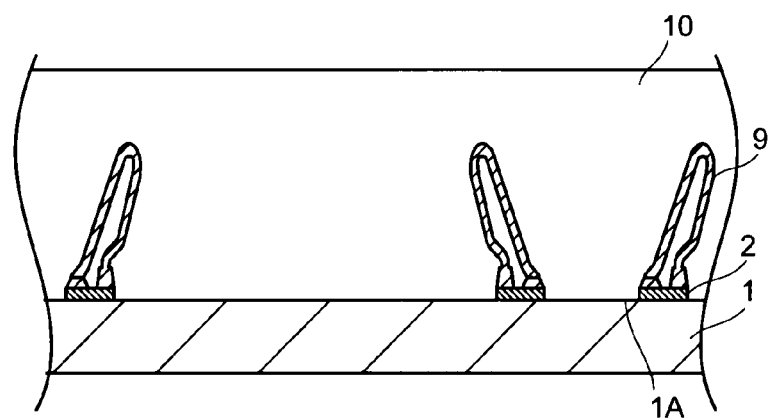

As shown in FIG. 1A, electrode pads 2 are formed on a main surface 1A of a semiconductor wafer (electronic component) 1, e.g., with integrated circuits thereon. As shown in FIG. 1B, then, bonding wires 9 are formed on the electrode pads 2, respectively so as to be elongated upward and shaped in loop. As shown in FIG. 1C, then, a surface protective resin layer 10 is applied thick on the main surface 1A of the semiconductor wafer 1 so as to embed the bonding wires 9.

The resin layer 10 may be formed by screen printing, dispensing, splay coating, spin coating. Preferably, the resin layer 10 is formed by screen printing because a low expansion resin containing inorganic fillers can be applied effectively according to the screen printing. With the screen printing, the periphery of the semiconductor wafer is not partially coated because the edge of the mask for screen printing is disposed on the periphery of the semiconductor wafer.

Figure 1D:
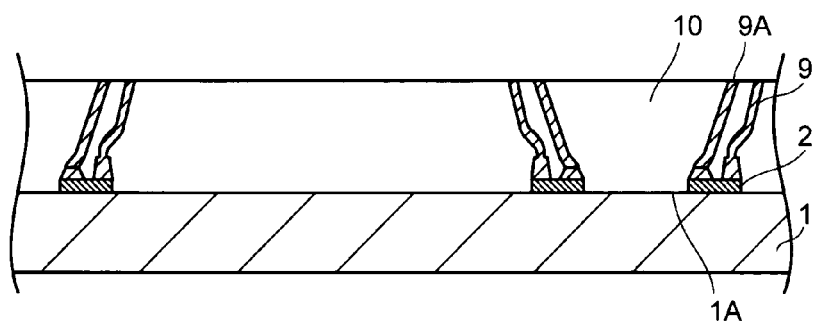

Then, after the surface protective resin layer 10 is hardened, as shown in FIG. 1D, the resin layer 10 is polished at the surface level lower than the forefronts of the bonding wires 9 so as to expose the ends 9A of the bonding wires 9. In this case, since the forefronts of the loop-shaped bonding wires 9 are removed, two wires are elongated upward from one of the electrode pads 2.

Figure 1E:
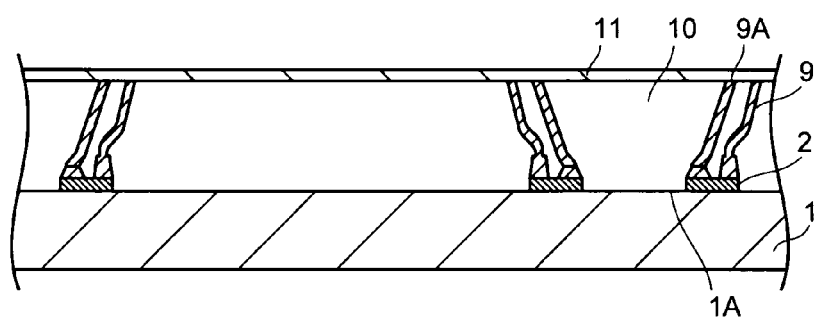
Figure 1F:
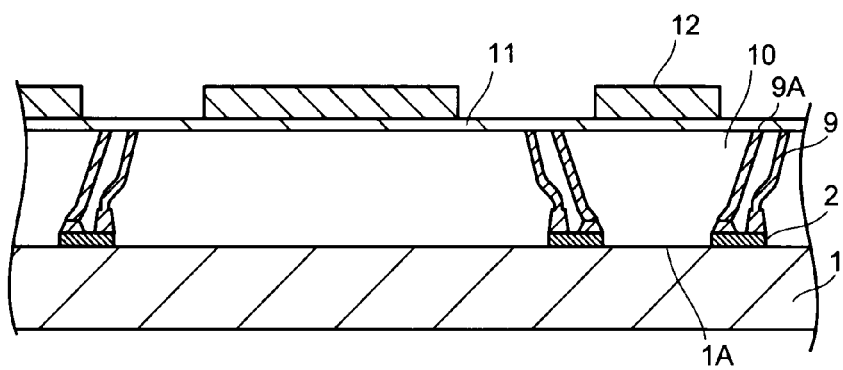

Then, as shown in FIG. 1E, a barrier metal 11 is formed over the grinded surface protective resin layer 10 and a resist layer is formed thick by spin coating. Then, as shown in FIG. 1F, the resist layer is opened at the areas containing the ends 9A of the bonding wires 9 so as to form a resist pattern 12.

Figure 2A:
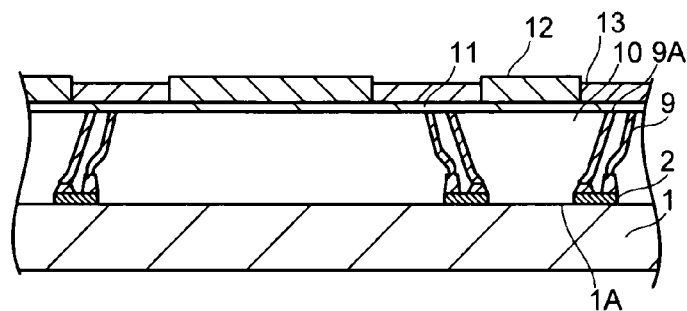
Figure 2B:
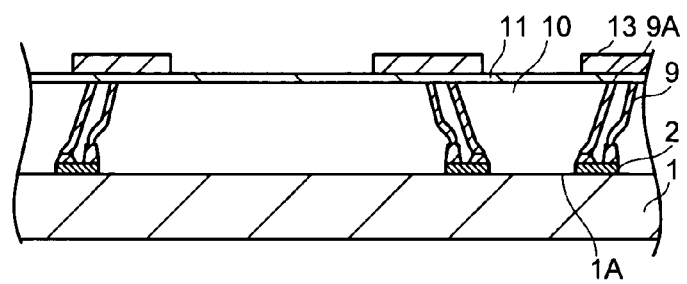
Figure 2C:
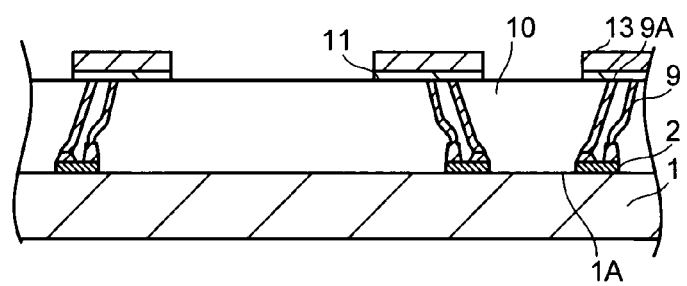

Then, as shown in FIG. 2A, electrolyte copper plated films 13 are formed by using the barrier metal 11 as a plating wire so as to embed the openings 12A of the resist pattern 12, and as shown in FIG. 2B, the resist pattern 12 is removed. Then, as shown in FIG. 2C, the barrier metal 11 is wet-etched by using the copper plated films 13 as a mask.

Figure 2D:
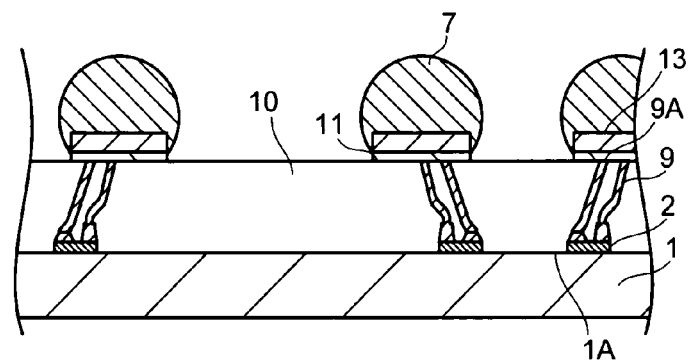
Figure 2E:
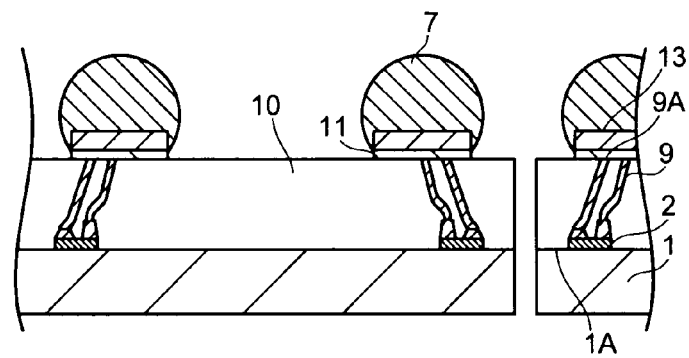

Then, as shown in FIG. 2D, solder balls 7 are mounted on the copper plated films 13 (mounting pads) and heated under reducing atmosphere or with a flux so as to be bonded with the copper plated films 13, thereby forming the mounting BGA terminals. The obtained semiconductor assembly is divided by diamond blade so as to form wafer level CSPs or electronic component packages as shown in FIG. 2E.

The photolithography of the thick resist layer and division of the semiconductor assembly requires the alignment of the semiconductor wafer 1 covered with the surface protective resin layer 10. In the case that the surface protective resin layer 10 is formed by screen printing, since the periphery of the semiconductor wafer 1 is not covered with the resin layer 10, as described above. Therefore, if some alignment marks are formed at the periphery of the semiconductor wafer 1, the above-described alignment process can be simplified in the photolithography of the thick resist layer and division of the semiconductor assembly. Alternatively, if the bonding wires 9 are shaped in characteristic loop, the bonding wires 9 may be employed for the alignment.

In this embodiment, since the solder balls (mounting BGA terminals) 7 and the semiconductor wafer (electronic component) 1 are separated by the thick surface protective resin layer 10 and the wiring distance is shortened, the parasitic capacitance of the intended electronic component package becomes small so that the electric characteristic of the intended electronic component package can be improved. Moreover, since the semiconductor wafer (electronic component) 1 is covered with the thick surface protective resin layer 10, the semiconductor wafer 1 is unlikely to be damaged so that the reliability of the semiconductor wafer 1 can be enhanced.

Furthermore, since the surface protective resin layer 10 can relax the difference in thermal expansion coefficient between the semiconductor wafer (electronic component) 1 and a mounting board, the reliability of the mounting connection between the semiconductor wafer 1 and the mounting board can be enhanced. In a conventional wafer level CSP, a surface protective resin layer can be formed thick as in this embodiment. In this case, however, since the wiring process is carried out by patterning using photolithograpy, the wiring process becomes difficult and the period of the wiring process is elongated due to the large thickness of the resin layer. As a result, the manufacturing efficiency of the intended electronic component package is deteriorated and the manufacturing cost of the intended electronic component package is increased. In this embodiment, the starting point and the ending point of each bonding wire 9 are required to be located on the same electrode pad and the photolithography is not required. As a result, the manufacturing efficiency of the intended electronic component package is improved and the manufacturing cost of the intended electronic component package is not increased. In this embodiment, moreover, balls 9C and bumps 9D are located on the semiconductor wafer 1 and not located above (refer to FIG. 4). This characteristic may be provided in other embodiments as described hereinafter.

Second Embodiment

FIG. 3 relates to steps in a method for manufacturing an electronic component package according to a second embodiment.

Figure 3A:
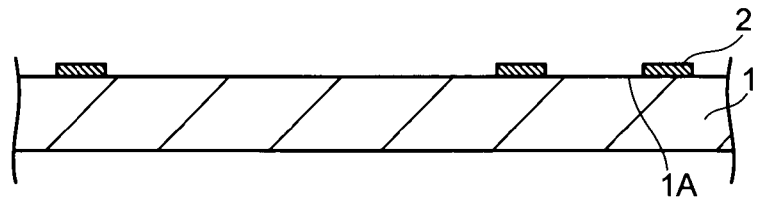
FIG. 3 relates to steps in a method for manufacturing an electronic component package according to a second embodiment.
Figure 3B:
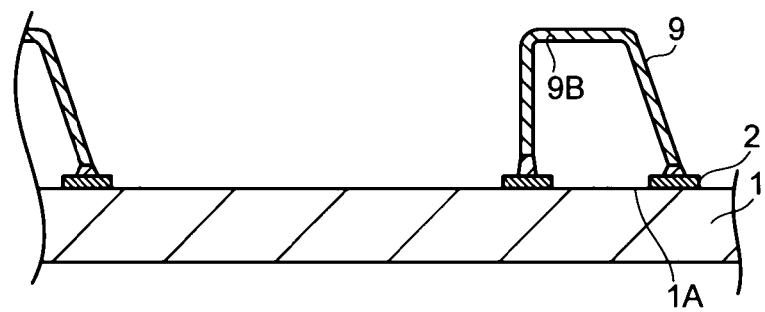
Figure 3C:
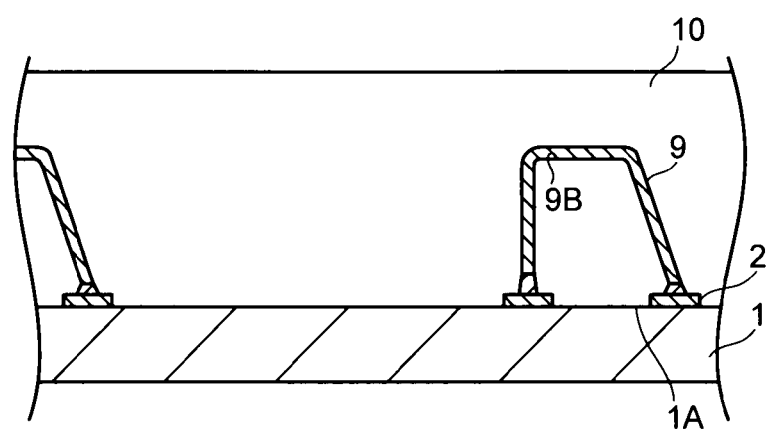

As shown in FIG. 3A, the patterned electrode pads 2 are formed on the main surface 1A of the semiconductor wafer (electronic component) 1. As shown in FIG. 3B, then, the bonding wires 9 are formed so as to be bridged between the adjacent electrode pads 2, elongated upward and shaped in trapezoid, respectively. As shown in FIG. 3C, then, the surface protective resin layer 10 is applied thick on the main surface 1A of the semiconductor wafer 1 so as to embed the bonding wires 9.

Figure 3D:
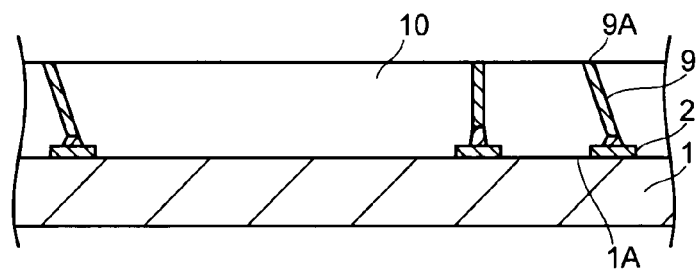

Then, after the surface protective resin layer 10 is hardened, as shown in FIG. 3D, the resin layer 10 is polished at the surface level lower than the upper bases of the bonding wires 9 so as to expose the ends 9A of the bonding wires 9.

Figure 3E:
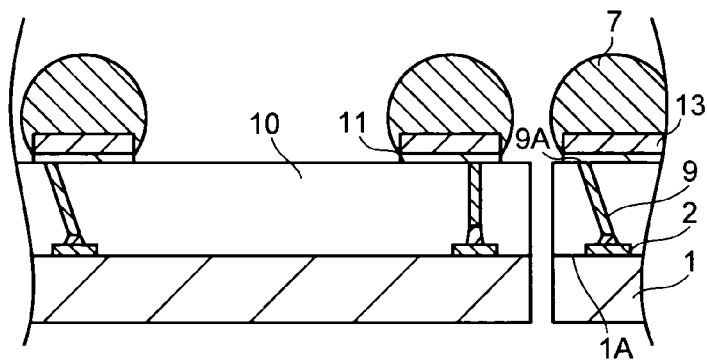

Then, as shown in FIG. 3E, the barrier metal 11 is formed over the grinded surface protective resin layer 10 and a resist layer is formed thick by spin coating. Then, the resist layer is opened at the areas containing the ends 9A of the bonding wires 9 so as to form the resist pattern 12. Then, the electrolyte copper plated films 13 (mounting pads) are formed by using the barrier metal 11 as a plating wire so as to embed the openings 12A of the resist pattern 12, and the resist pattern 12 is removed. Then, the barrier metal 11 is wet-etched by using the copper plated films 13 as a mask. Then, the solder balls 7 are mounted on the copper plated films 13 (mounting pads) and heated under reducing atmosphere or with a flux so as to be bonded with the copper plated films 13, thereby forming the mounting BGA terminals. Lastly, the thus obtained semiconductor assembly is divided by diamond blade so as to form wafer level CSPs or electronic component packages.

In this embodiment, as described above, the electrode pads 2 of the semiconductor wafer (electronic component) are electrically connected with the solder balls (mounting pads) not by photolithography so as to obtain the intended electronic component package. Moreover, the locating pad of the starting point of each of the bonding wires 9 is different from the locating pad of the ending point of each of the bonding wires 9. Then, the upper base of each of the bonding wires 9 is removed so that one of the copper plated films 13 is electrically connected with one of the electrode pads 2 with the solder balls 7 mounted thereon on the semiconductor wafer 1 by one wire, respectively.

Third Embodiment

In this embodiment, the configuration of a wire bonder for forming the looped bonding wire will be described. FIG. 4 relates to the process flow about the use of the wire bonder. The wire bonder shown in FIG. 4 includes an ultrasonic transducer 15, a conical tube 14 (called as a "capillary") made of ruby and provided at the end of the ultrasonic transducer 15, a bonding wire 9 provided through the capillary 14, a clamper 16 for pinching and fixing the bonding wire 9 which is disposed above the capillary 14 and a torch (not shown) for melting the forefront of the bonding wire through the electric discharge for the bonding wire to form a ball 9C. The torch is disposed in the vicinity of the capillary 14.

Figure 4A:
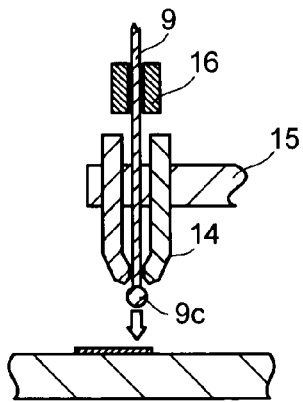
FIGS. 4 and 5 relates to process flow about the use of a wire bonder according to a third embodiment.
Figure 4B:
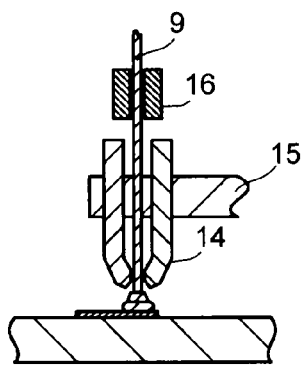
Figure 4C:
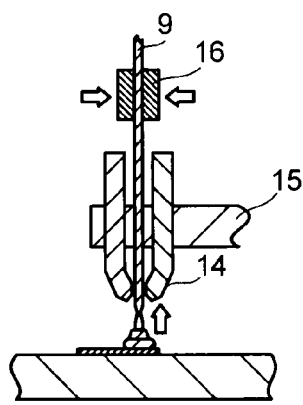
Figure 4D:
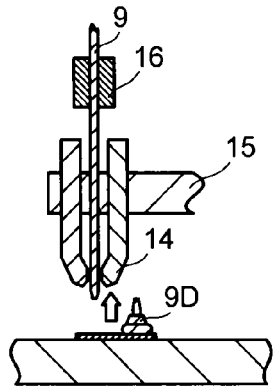
Figure 4E:
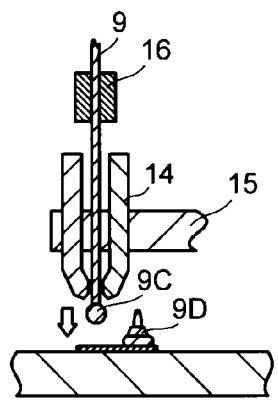
Figure 4F:
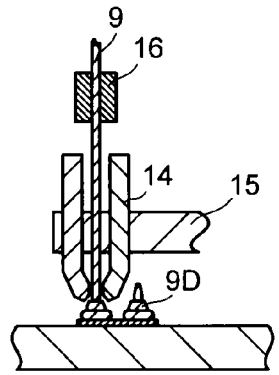

After the ball 9C is formed at the forefront of the bonding wire 9 by the torch (FIG. 4A), the ball 9C is fixed on the electrode pad 2 by ultrasonic connection. On the electrode pad 2 is formed the one end of the bonding wire 9 shaped in loop as described above (FIG. 4B). Then, the capillary 14 is hoisted up while the bonding wire 9 is pinched by the clamper 16 (FIG. 4C) so that the bonding wire 9 can be torn off and thus, a bump 9D can be formed (FIG. 4D).

Figure 4G:
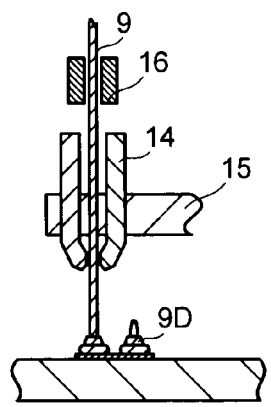
Figure 4H:
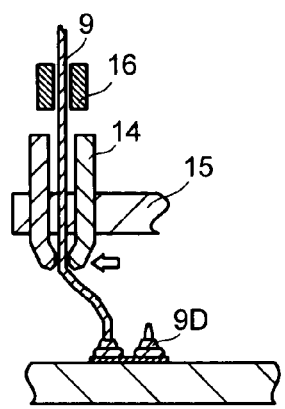

Then, after the ball 9C is formed at the forefront of the bonding wire 9 again by the torch (not shown), the ball 9C is fixed on the electrode pad 2 by ultrasonic connection. On the electrode pad 2 is formed the one end of the bonding wire 9 shaped in loop as described above (FIG. 4E). Then, the capillary 14 is hoisted up while the bonding wire 9 is not pinched by the clamper 16 (FIG. 4F) so that the bonding wire 9 can be hoisted up to a predetermined height level for forming the loop shape of the bonding wire (FIG. 4G).

Figure 4I:
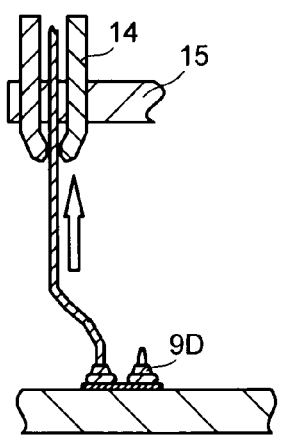
Figure 4J:
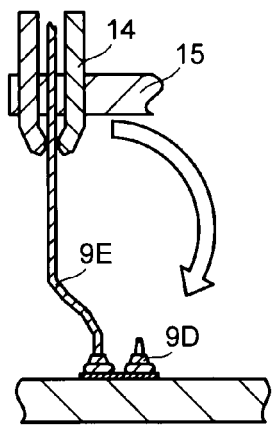
Figure 4K:
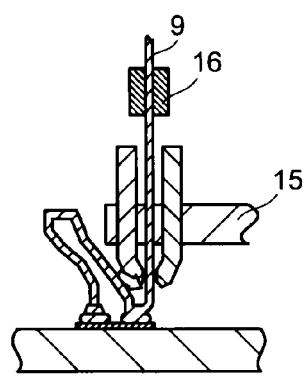
Figure 4L:
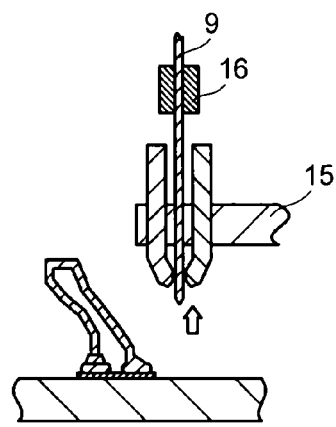

Then, the capillary 14 is moved laterally so that the midpoint of the bonding wire 9 can be bended (FIG. 4H), and the capillary 14 is hoisted up again while the bonding wire 9 is not pinched by the clamper 16 so that the bonding wire 9 can be elongated long enough to form the loop shape of the bonding wire 9 (FIG. 4I). Then, the capillary 14 is moved to the bump 9D around the supporting point 9E while the bonding wire 9 is pinched by the clamper 16 (FIG. 4J), and the bonding wire 9 is torn off and then, boned with the bump 9D (FIG. 4K). As a result, the intended looped bonding wire 9 can be formed under high aspect ratio (FIG. 4I). According to this embodiment, only the simple process of moving the capillary 14 laterally and bending the midpoint of the bonding wire 9 can provide the looped bonding wire as described above.

FIG. 5 relates to another process flow about the use of the wire bonder. After the ball 9C is formed at the forefront of the bonding wire 9 by the torch (not shown) (FIG. 5A), the ball 9C is fixed on the electrode pad 2 by ultrasonic connection. On the electrode pad 2 is formed the one end of the bonding wire 9 shaped in loop as described above (FIG. 5B). Then, the capillary 14 is hoisted up to a predetermined height so as to form a pillar from the bonding wire 9 while the bonding wire 9 is not pinched by the clamper 16 (FIG. 5C).

Figure 5A:
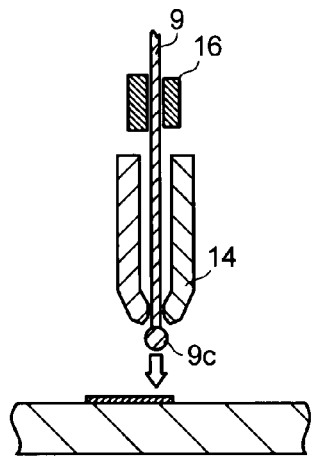
Figure 5B:
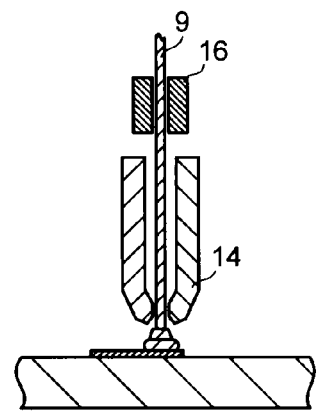
Figure 5C:
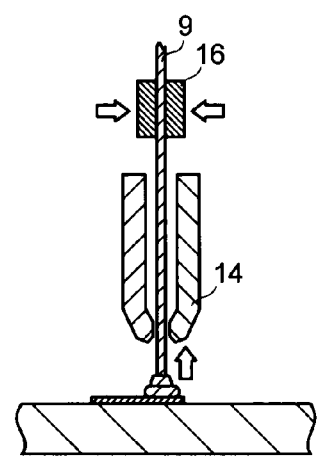
Figure 5D:
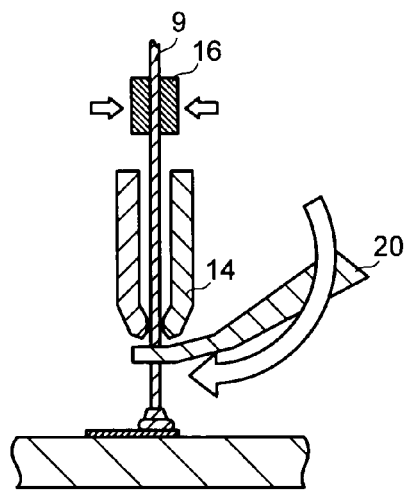
Figure 5E:
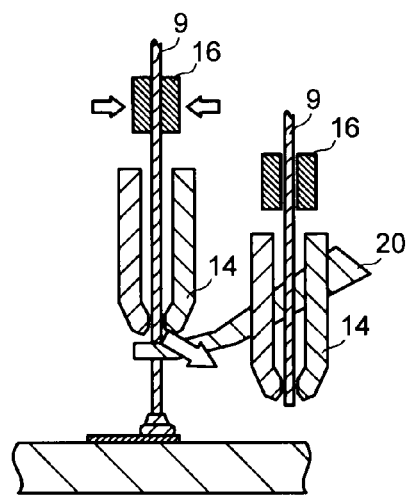
Figure 5F:
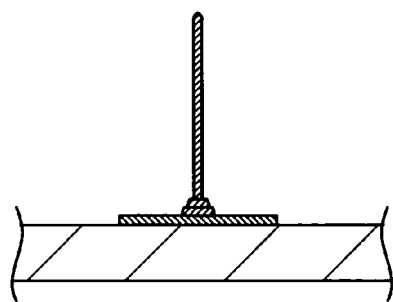

Then, a blade 20 is disposed in the vicinity of the bonding wire 9 located at the forefront of the capillary 14 (FIG. 5D), and the capillary 14 is moved laterally to the blade 20 while the blade 20 is fixed so that the bonding wire 9 can be torn off by the shear strain between the capillary 14 and the blade 20 (FIG. 5E). As a result, the intended pillar with a predetermined height can be formed through the cutting of the bonding wire 9 (FIG. 5F).

According to this embodiment, the pillar bonding wire can be formed in addition to the looped bonding wire as described above.

Fourth Embodiment

FIGS. 6 to 8 relate to steps in a method for manufacturing an electronic component package according to a fourth embodiment. The fourth embodiment is different from the first and second embodiments in that a MEMS is formed on the semiconductor wafer.

Figure 6A:
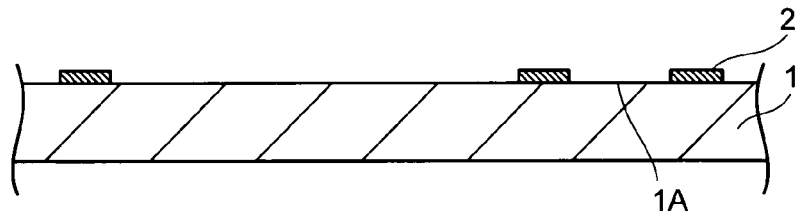
FIGS. 6 to 8 relates to steps in a method for manufacturing an electronic component package according to a fourth embodiment.
Figure 6B:
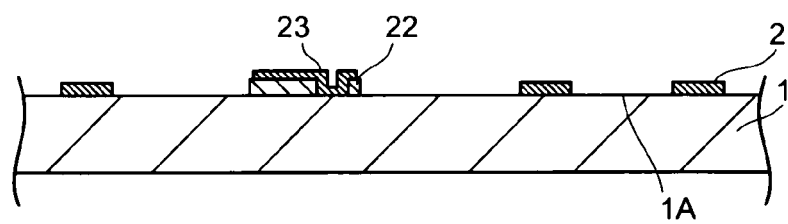
Figure 6C:
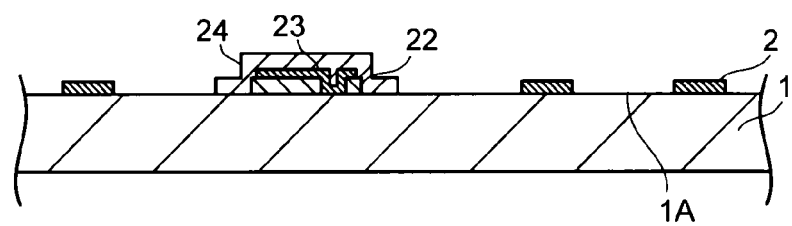
Figure 6D:
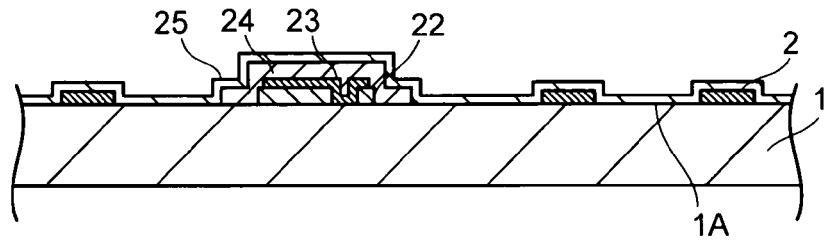

As shown in FIG. 6A, the electrode pads 2 are formed on the main surface 1A of the semiconductor wafer. As shown in FIG. 6B, then, a first sacrificial layer 22 is formed on the main surface 1A of the semiconductor wafer 1, and a movable part 23 of the MEMS is formed on the first sacrificial layer 22. As shown in FIG. 6C, then, a second sacrificial layer 24 is formed so as to cover the movable part 23. As shown in FIG. 6D, then, a cap layer 25 is formed over the main surface 1A of the semiconductor wafer 1 so as to cover the second sacrificial layer 24.

Figure 6E:
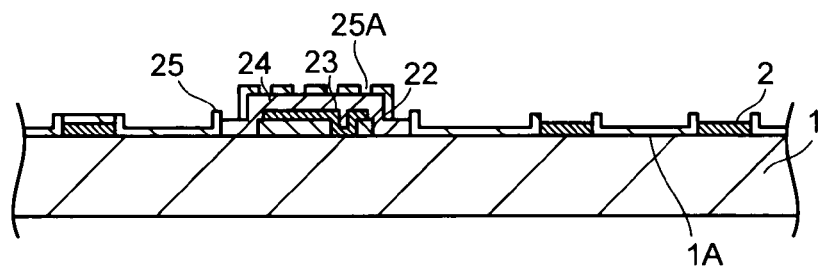
Figure 6F:
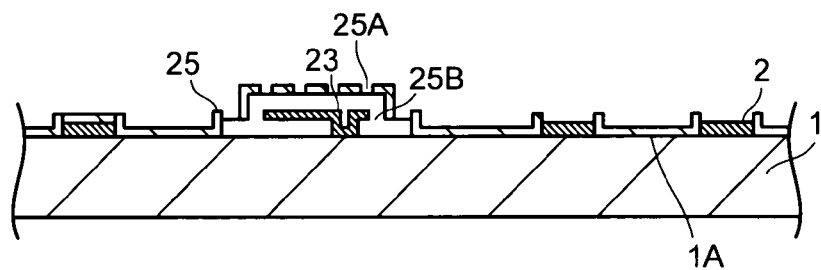
Figure 7A:
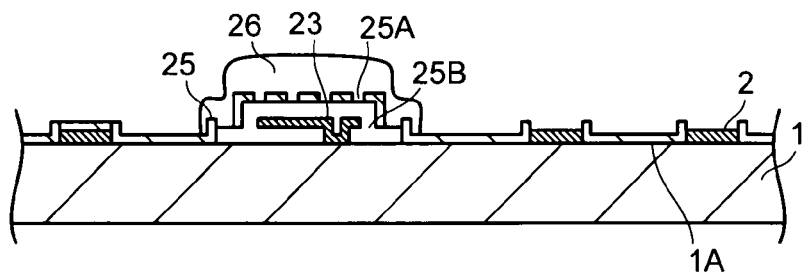
Figure 7B:
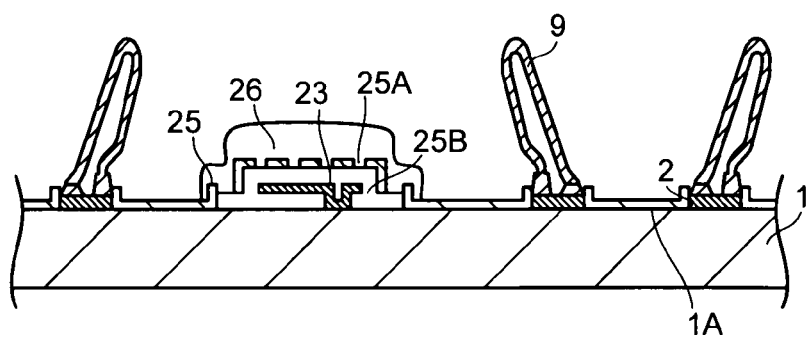

As shown in FIG. 6E, openings 25A are formed at the cap layer 25 so as to partially expose the second sacrificial layer 24, and as shown in FIG. 6F, the first sacrificial layer 22 and the second sacrificial layer 24 are etched via the openings 25A, and thus, partially removed. A cavity 25B is formed so that the movable part 23 is disposed in the cavity 25B. As shown in FIG. 7B, a resin layer 26 is formed so as to embed the openings 25A.

Figure 7C:
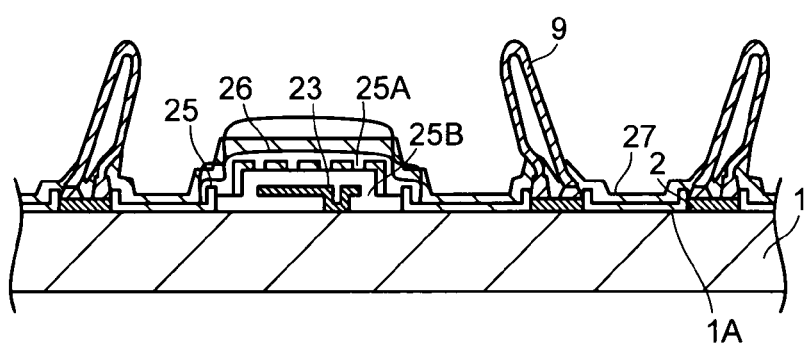

Then, as shown in FIG. 7B, the bonding wires 9 are formed on the electrode pads 2 so as to be elongated upward from the electrode pads 2, respectively. Then, as shown in FIG. 7C, the thus obtained wafer assembly is heated so as to dry the interior of the cavity 25B via the resin layer 26, and an inorganic insulating film 27 is formed over the wafer assembly by CVD or sputtering. In this case, a getter for absorbing moisture may be added in the resin layer 26 so that the heating process can be omitted or the heating temperature can be lowered and/or the heating period can be shortened. The insulating film 27 is not required to be patterned.

Figure 7D:
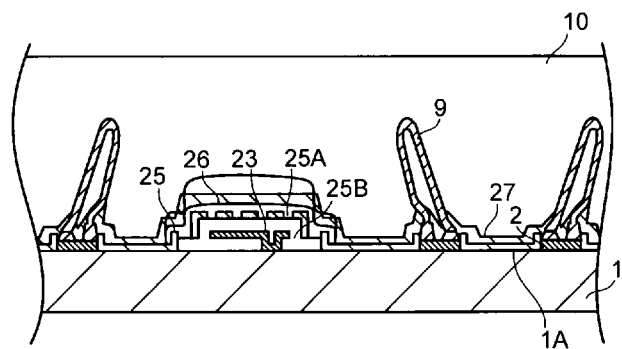

Then, as shown in FIG. 7D, the surface protective resin layer 10 is formed over the semiconductor assembly so as to embed the bonding wires 9.

Figure 7E:
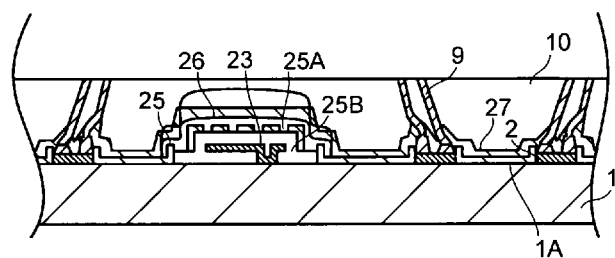
Figure 7F:
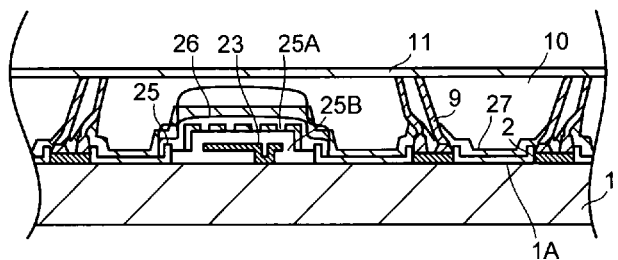

Then, after the surface protective resin layer 10 is hardened, as shown in FIG. 7E, the resin layer 10 is grinded at the surface level lower than the forefronts of the bonding wires 9 so as to expose the ends 9A of the bonding wires 9. Since the forefronts of the loop-shaped bonding wires 9 are removed, two wires are elongated upward from one of the electrode pads 2.

Since the height of the movable part 23 is sufficiently smaller than the height (length) of the bonding wires 9, the movable part 23 can not be exposed from on the resin layer 10.

Figure 8A:
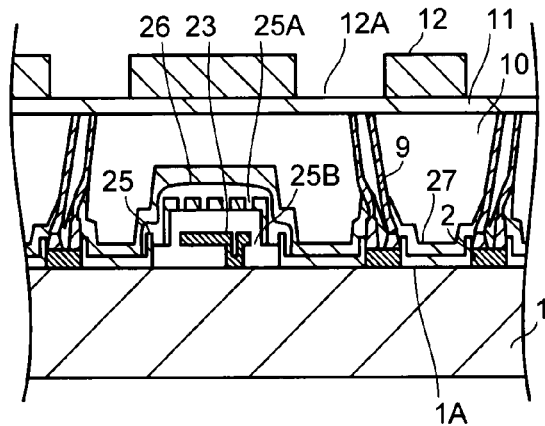
Figure 8B:
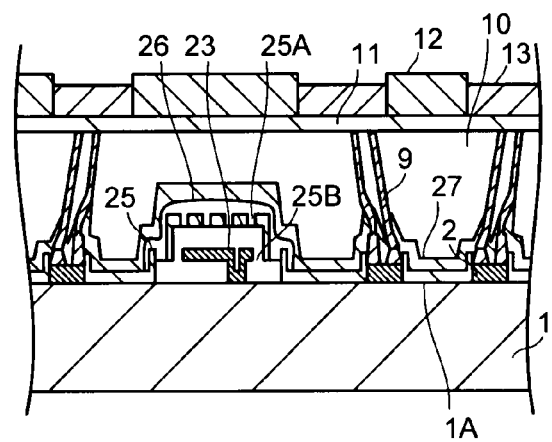
Figure 8C:
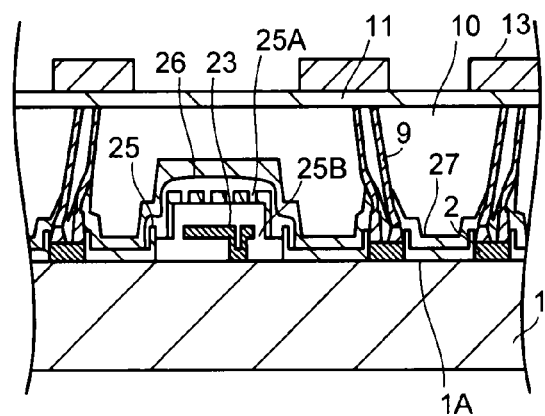
Figure 8D:
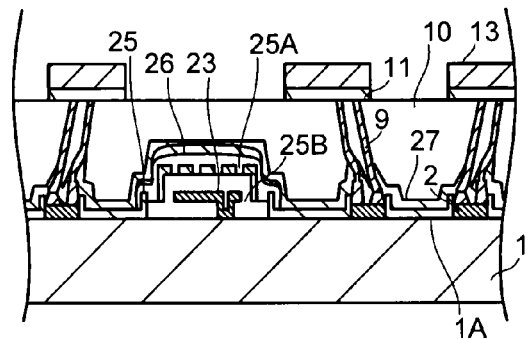

Then, as shown in FIG. 7E, the barrier metal 11 is formed over the grinded surface protective resin layer 10 and a resist layer is formed thick by spin coating. Then, as shown in FIG. 8A, the resist layer is opened at the areas containing the ends 9A of the bonding wires 9 so as to form a resist pattern 12. Then, as shown in FIG. 8B, the electrolyte copper plated films 13 (mounting pads) are formed by using the barrier metal 11 as a plating wire so as to embed the openings 12A of the resist pattern 12, and as shown in FIG. 8C, the resist pattern 12 is removed. Then, as shown in FIG. 8D, the barrier metal 11 is wet-etched by using the copper plated films 13 as a mask.

Figure 8E:
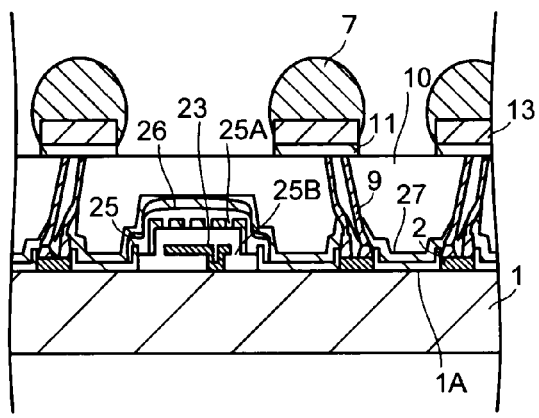
Figure 8F:
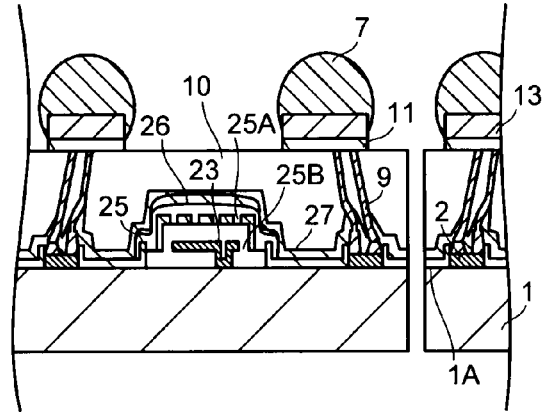

Then, as shown in FIG. 8E, the solder balls 7 are mounted on the copper plated films 13 and heated under reducing atmosphere or with a flux so as to be bonded with the copper plated films 13, thereby forming the mounting BGA terminals. Lastly, the thus obtained semiconductor assembly is divided by diamond blade so as to form wafer level CSPs or electronic component packages as shown in FIG. 8F.

In this embodiment, since the movable part 23 of the MEMS is mounted on the semiconductor wafer 1, the surface of the semiconductor assembly becomes bumpy as a whole. It is difficult, therefore, that a resist layer can not be formed uniformly on the semiconductor assembly by spin coating and a developing process can not be carried out under good condition so that the photolithography process can not be carried out under good condition. In this embodiment, since the electrode pads 2 of the semiconductor wafer (electronic component) 1 and the solder balls (mounting BGA terminals) 7 are directly connected with the bonding wires 9 under no photolithography, the above-described problems originated from the photolithography can not occur.

In this embodiment, the movable part 23 of the MEMS is disposed in the cavity 25B, but a cap may be formed on the movable part 23. Then, the movable part 23 may be embedded into the semiconductor wafer 1 and covered with a plane film. In the latter case, the semiconductor wafer (electronic component) 1 can function as the MEMS by itself. Moreover, the configuration of each bonding wire may be formed in the same manner as in Second Embodiment. Namely, one of the copper plated films 13 is electrically connected with one of the electrode pads 2 on the semiconductor wafer 1 by one wire. The bonding wire characteristic may be applied for other embodiments as will described below.

Fifth Embodiment

FIGS. 9 and 10 relate to steps in a method for manufacturing an electronic component package according to a fifth embodiment. In this embodiment, a second electronic component is provided on the semiconductor wafer under the face-down condition.

Figure 9A:
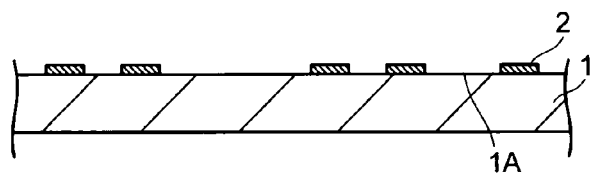
FIGS. 9 to 10 relates to steps in a method for manufacturing an electronic component package according to a fifth embodiment.
Figure 9B:
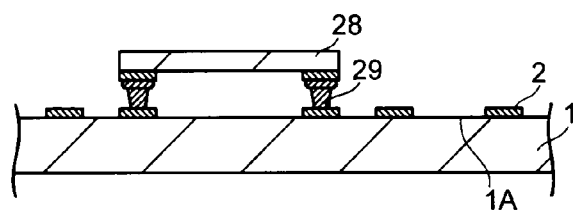
Figure 9C:
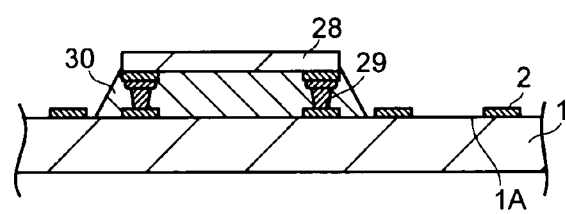

As shown in FIG. 9A, the electrode pads 2, which are formed through patterning, are formed on the main surface 1A of the semiconductor wafer (electronic component) 1. As shown in FIG. 9B, then, a second electronic component 28 is formed above the semiconductor wafer 1 so that the functional surface of the second electronic component 28 is faced to the main surface 1A of the semiconductor wafer 1. The second electronic component 28 is electrically and mechanically connected with the electrode pads 2 via connection bumps 29. Then, as shown in FIG. 9C, an epoxy resin 30 is infiltrated between the semiconductor wafer 1 and the second electronic component 28 by utilizing the capillary phenomenon of the epoxy resin, and hardened. In this case, the support of the second electronic component 28 can be reinforced by the epoxy resin 30.

Figure 9D:
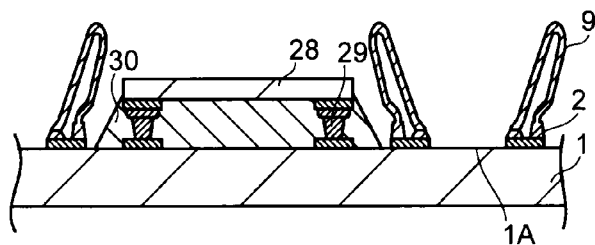
Figure 9E:
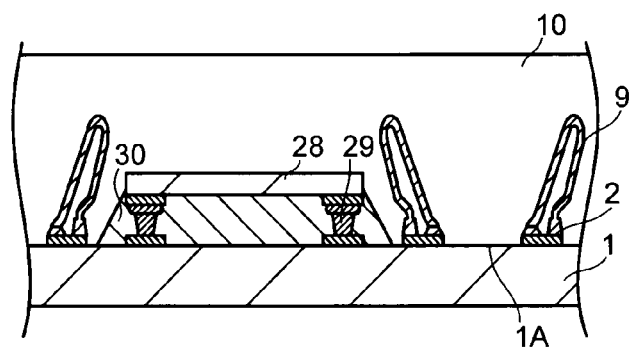

Then, as shown in FIG. 9D, the bonding wires 9 are formed on the electrode pads 2 so as to be elongated upward from the electrode pads 2 and shaped in loop, respectively. Then, as shown in FIG. 9E, the surface protective resin layer 10 is formed over the main surface 1A of the semiconductor wafer 1 so as to embed the bonding wires 9.

Figure 9F:
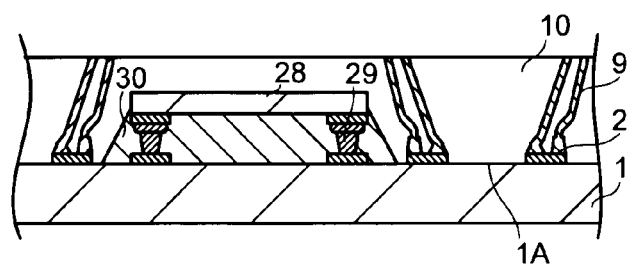

Then, after the surface protective resin layer 10 is hardened, as shown in FIG. 9F, the resin layer 10 is grinded at the surface level lower than the forefronts of the bonding wires 9 so as to expose the ends 9A of the bonding wires 9. In this case, since the forefronts of the loop-shaped bonding wires 9 are removed, two wires are elongated upward from one of the electrode pads 2. In contrast, since the top surface of the second electronic component is located sufficiently below the forefronts of the bonding wires 9, the top surface of the second electronic component can not be exposed from the resin layer 10.

Figure 9G:
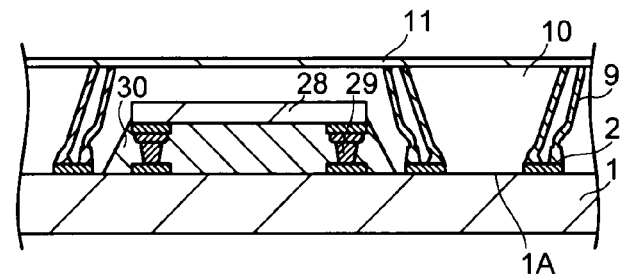
Figure 10A:
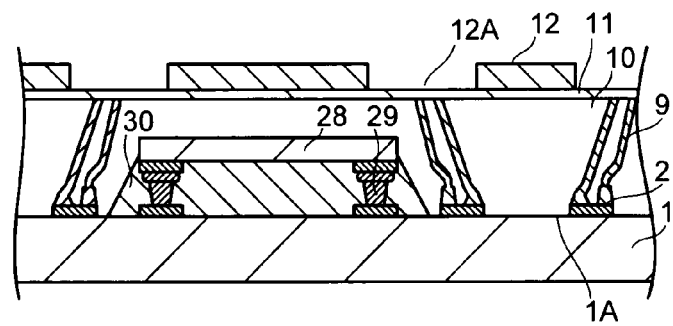
Figure 10B:
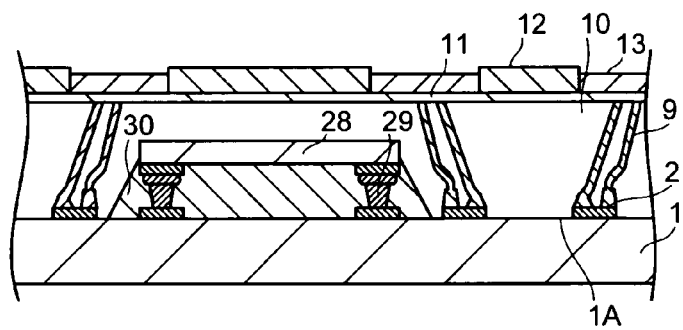
Figure 10C:
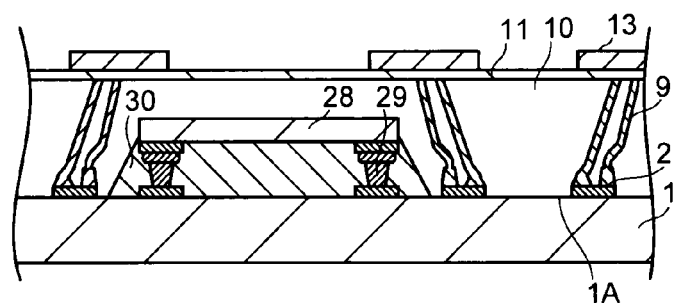
Figure 10D:
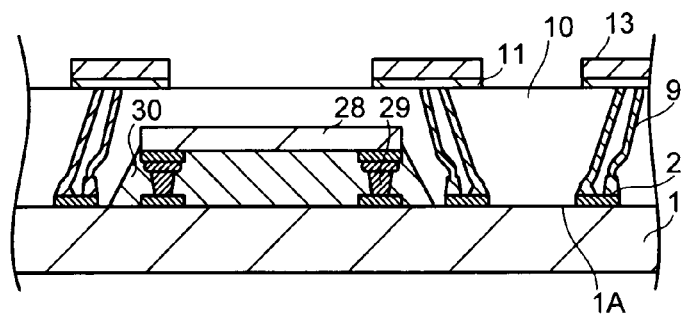
Figure 10E:
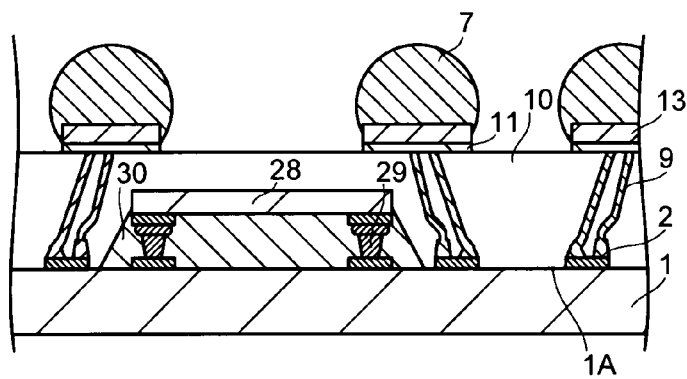

Then, as shown in FIG. 9G, the barrier metal 11 is formed over the grinded surface protective resin layer 10 and a resist layer is formed thick by spin coating. Then, as shown in FIG. 10A, the resist layer is opened at the areas containing the ends 9A of the bonding wires 9 so as to form a resist pattern 12. Then, as shown in FIG. 10B, the electrolyte copper plated films 13 (mounting pads) are formed by using the barrier metal 11 as a plating wire so as to embed the openings 12A of the resist pattern 12, and as shown in FIG. 10C, the resist pattern 12 is removed. Then, as shown in FIG. 10D, the barrier metal 11 is wet-etched by using the copper plated films 13 as a mask.

Figure 10F:
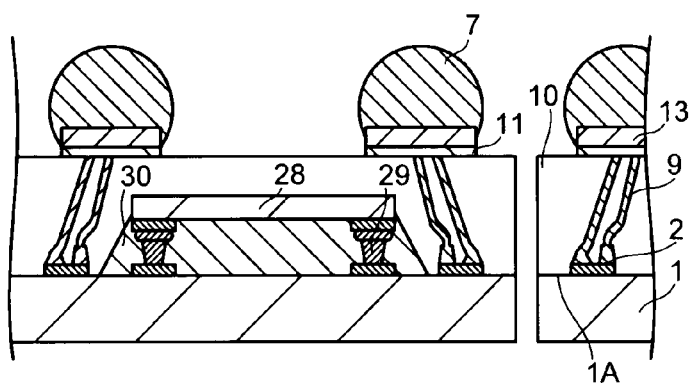

Then, as shown in FIG. 1E, the solder balls 7 are mounted on the copper plated films 13 and heated under reducing atmosphere or with a flux so as to be bonded with the copper plated films 13, thereby forming the mounting BGA terminals. Lastly, the thus obtained semiconductor assembly is divided by diamond blade so as to form wafer level CSPs or electronic component packages as shown in FIG. 10F.

In this embodiment, since the second electronic component 28 is mounted above the semiconductor wafer 1, the surface of the semiconductor assembly becomes bumpy as a whole. It is difficult, therefore, that a resist layer can not be formed uniformly on the semiconductor assembly by spin coating and a developing process can not be carried out under good condition so that the photolithography process can not be carried out under good condition. In this embodiment, since the electrode pads 2 of the semiconductor wafer (electronic component) 1 and the solder balls (mounting BGA terminals) 7 are directly connected with the bonding wires 9 under no photolithography, the above-described problems originated from the photolithography can not occur.

Sixth Embodiment

FIGS. 11 to 13 relate to steps in a method for manufacturing an electronic component package according to a sixth embodiment. In this embodiment, the MEMS is provided on the semiconductor wafer and the second electronic component is provided under the face-down condition so as to sandwich the MEMS with the semiconductor wafer.

Figure 11A:
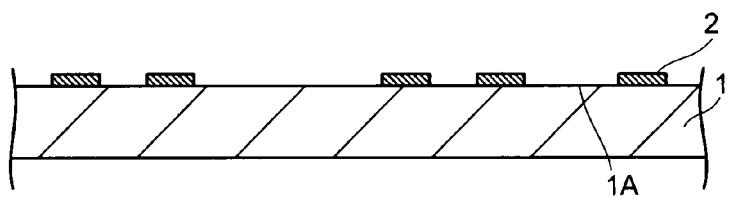
FIGS. 11 to 13 relates to steps in a method for manufacturing an electronic component package according to a sixth embodiment.
Figure 11B:
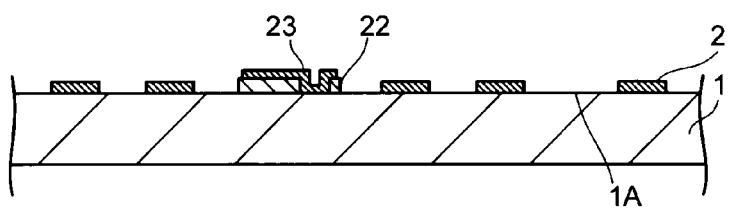
Figure 11C:
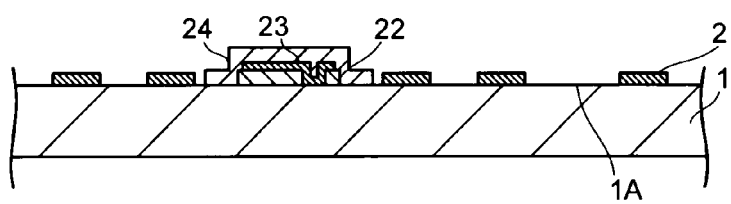
Figure 11D:
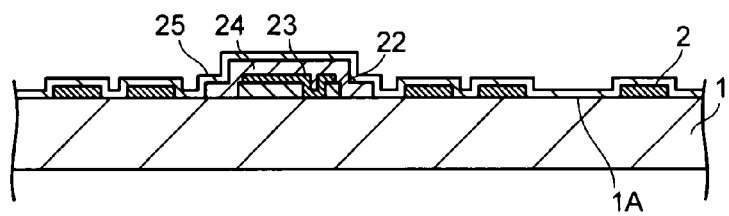

As shown in FIG. 11A, the electrode pads 2 are formed on the main surface 1A of the semiconductor wafer (electronic component) 1. As shown in FIG. 11B, then, the first sacrificial layer 22 is formed on the main surface 1A of the semiconductor wafer 1, and the movable part 23 of the MEMS is formed on the first sacrificial layer 22. As shown in FIG. 11C, then, the second sacrificial layer 24 is formed so as to cover the movable part 23. As shown in FIG. 11D, then, the cap layer 25 is formed over the main surface 1A of the semiconductor wafer 1 so as to cover the second sacrificial layer 24.

Figure 11E:
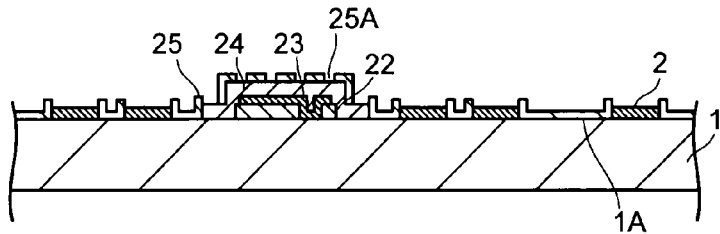
Figure 11F:
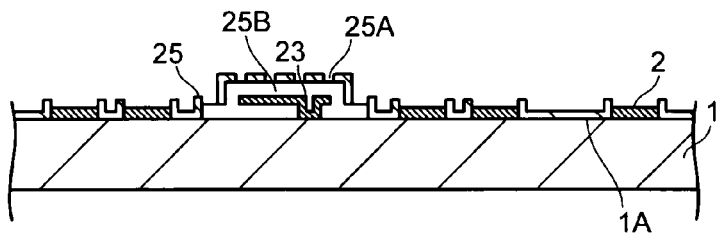
Figure 11G:
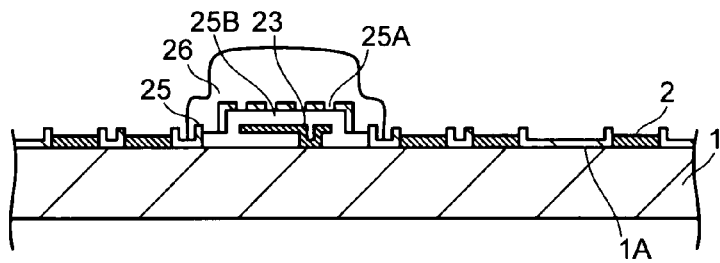
Figure 11H:
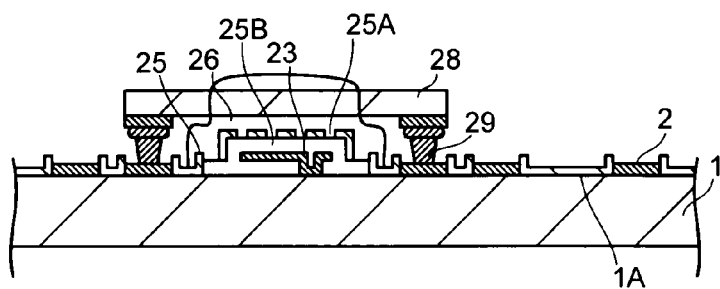

As shown in FIG. 11E, the openings 25A are formed at the cap layer 25 so as to partially expose the second sacrificial layer 24, and as shown in FIG. 11F, the first sacrificial layer 22 and the second sacrificial layer 24 are etched via the openings 25A, and thus, partially removed. As a result, the cavity 25B is formed so that the movable part 23 is disposed in the cavity 25B. Then, as shown in FIG. 11G, the resin layer 26 is formed so as to embed the openings 25A. Then, as shown in FIG. 11H, the second electronic component 28 is formed above the semiconductor wafer 1 so that the functional surface of the second electronic component 28 is faced to the main surface 1A of the semiconductor wafer 1. The second electronic component 28 is electrically and mechanically connected with the electrode pads 2 via connection bumps 29.

Figure 12A:
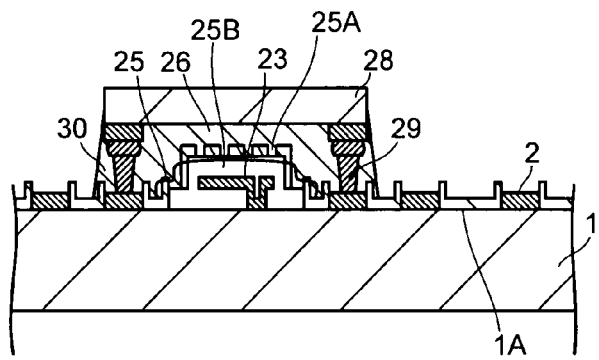
Figure 12B:
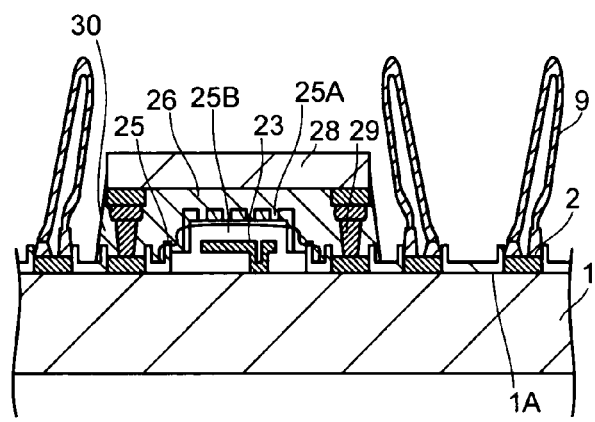

Then, as shown in FIG. 12A, the epoxy resin 30 is infiltrated between the semiconductor wafer 1 and the second electronic component 28 by utilizing the capillary phenomenon of the epoxy resin, and hardened. Alternatively, the epoxy resin 30 is coated on the rear surface of the second electronic component 28, and the second electronic component 28 is faced against the semiconductor wafer 1 as shown in FIG. 12B. In this case, the support of the second electronic component 28 can be also reinforced by the epoxy resin 30.

Then, as shown in FIG. 12B, the bonding wires 9 are formed on the electrode pads 2 so as to be elongated upward from the electrode pads 2 and shaped in loop, respectively.

Figure 12C:
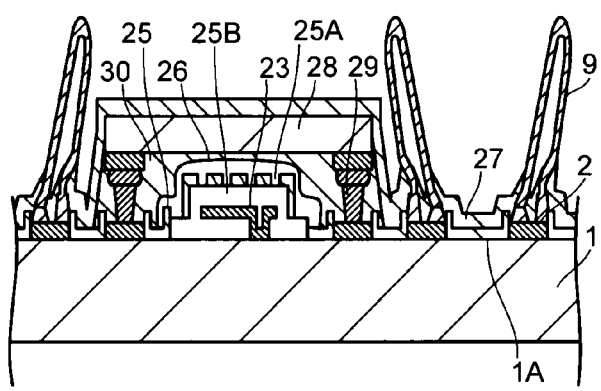

Then, as shown in FIG. 12C, the thus obtained wafer assembly is heated so as to dry the interior of the cavity 25B via the resin layer 26, and the inorganic insulating film 27 is formed over the wafer assembly by CVD or sputtering. In this case, the getter for absorbing moisture may be added in the resin layer 26 so that the heating process can be omitted or the heating temperature can be lowered and/or the heating period can be shortened.

Figure 12D:
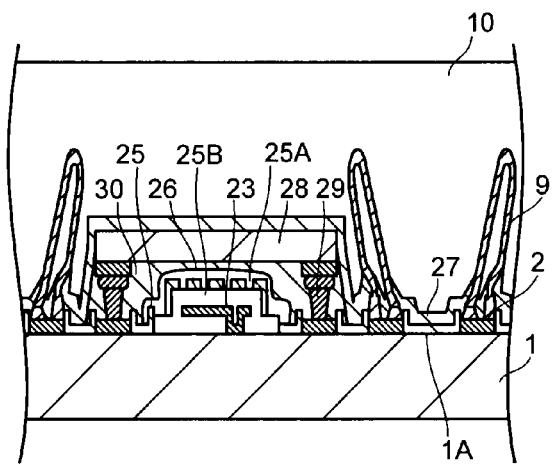

Then, as shown in FIG. 12D, the surface protective resin layer 10 is formed over the semiconductor assembly so as to embed the bonding wires 9, the movable part 23 of the MEMS and the second electronic component 28.

Figure 12E:
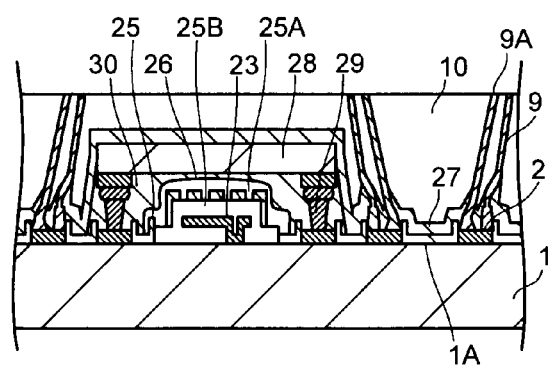

Then, after the surface protective resin layer 10 is hardened, as shown in FIG. 12E, the resin layer 10 is grinded at the surface level lower than the forefronts of the bonding wires 9 so as to expose the ends 9A of the bonding wires 9. In this case, since the forefronts of the loop-shaped bonding wires 9 are removed, two wires are elongated upward from one of the electrode pads 2. In contrast, since the top surface of the second electronic component is located sufficiently below the forefronts of the bonding wires 9, the top surface of the second electronic component can not be exposed from the resin layer 10.

Figure 12F:
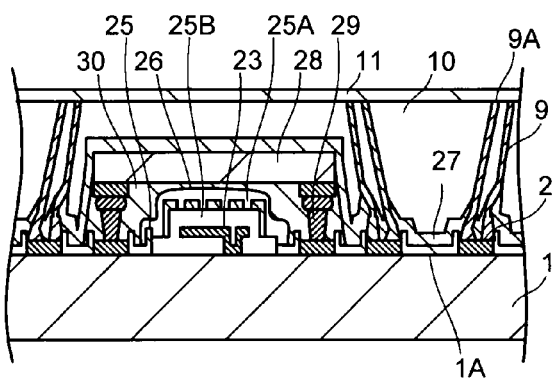
Figure 13A:
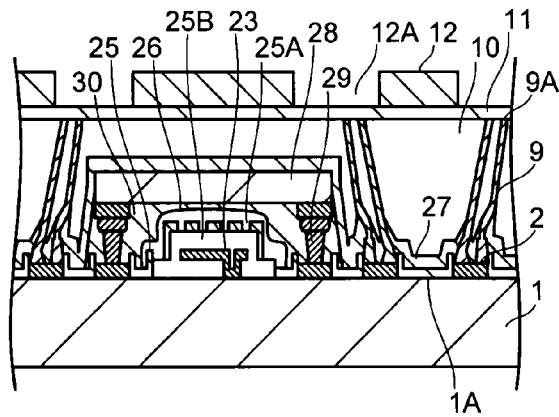
Figure 13B:
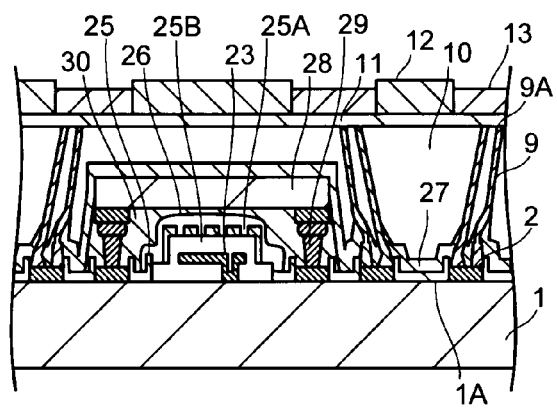
Figure 13C:
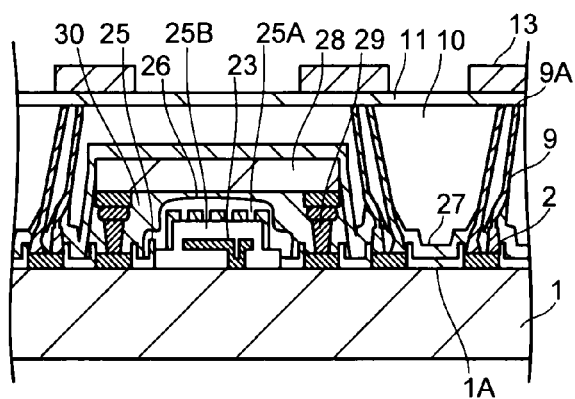
Figure 13D:
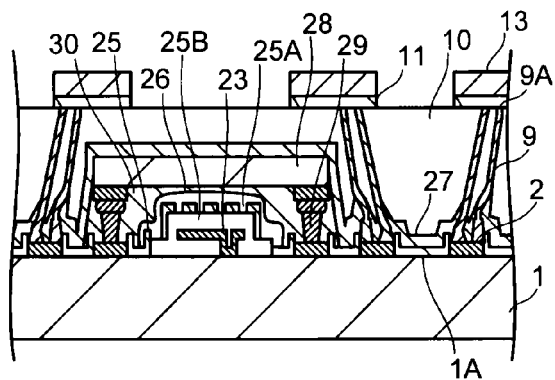

Then, as shown in FIG. 12F, the barrier metal 11 is formed over the grinded surface protective resin layer 10 and the resist layer is formed thick by spin coating. Then, as shown in FIG. 13A, the resist layer is opened at the areas containing the ends 9A of the bonding wires 9 so as to form the resist pattern 12. Then, as shown in FIG. 13B, the electrolyte copper plated films 13 (mounting pads) are formed by using the barrier metal 11 as a plating wire so as to embed the openings 12A of the resist pattern 12, and as shown in FIG. 13C, the resist pattern 12 is removed. Then, as shown in FIG. 13D, the barrier metal 11 is wet-etched by using the copper plated films 13 as a mask.

Figure 13E:
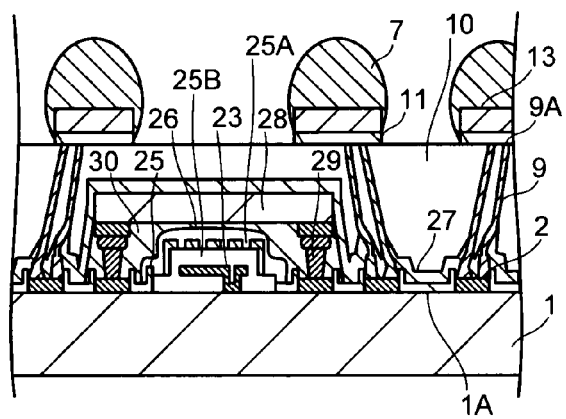
Figure 13F:
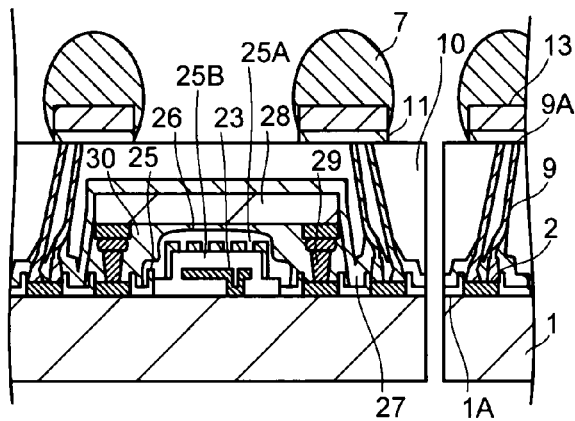

Then, as shown in FIG. 13E, the solder balls 7 are mounted on the copper plated films 13 and heated under reducing atmosphere or with a flux so as to be bonded with the copper plated films 13, thereby forming the mounting BGA terminals. Lastly, the thus obtained semiconductor assembly is divided by diamond blade so as to form wafer level CSPs or electronic component packages as shown in FIG. 13F.

In this embodiment, since the movable part 23 of the MEMS is mounted on the semiconductor wafer 1 and the second electronic component 28 is mounted above the semiconductor wafer 1, the surface of the semiconductor assembly becomes bumpy as a whole. It is difficult, therefore, that a resist layer can not be formed uniformly on the semiconductor assembly by spin coating and a developing process can not be carried out under good condition so that the photolithography process can not be carried out under good condition. In this embodiment, since the electrode pads 2 of the semiconductor wafer (electronic component) 1 and the solder balls 7 (mounting BGA terminals) 7 are directly connected with the bonding wires 9 under no photolithography, the above-described problems originated from the photolithography can not occur.

Moreover, the movable part 23 of the MEMS can be protected by the second electronic component 28. Furthermore, since the distance between the movable part 23 of the MEMS and the second electronic component 28 is short so that the movable part 23 can be connected with the second electronic component 28 by low inductance wire connection, the high velocity signal transmission can be realized. In addition, the insulating film 27 is not required to be patterned as described above.

In this embodiment, the movable part 23 of the MEMS is disposed in the cavity 25B, but a cap may be formed on the movable part 23. Then, the movable part 23 may be embedded into the semiconductor wafer 1 and covered with a plane film.

Seventh Embodiment

FIGS. 14 and 15 relate to steps in a method for manufacturing an electronic component package according to a seventh embodiment. In this embodiment, the second electronic component is provided on the semiconductor wafer under the face-up condition.

Figure 14A:
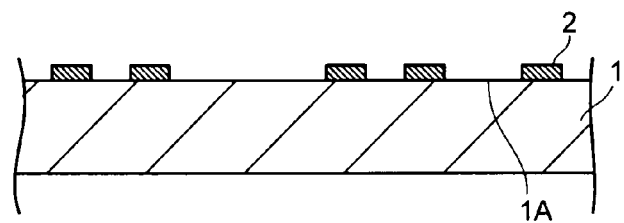
FIGS. 14 to 15 relates to steps in a method for manufacturing an electronic component package according to a seventh embodiment.
Figure 14B:
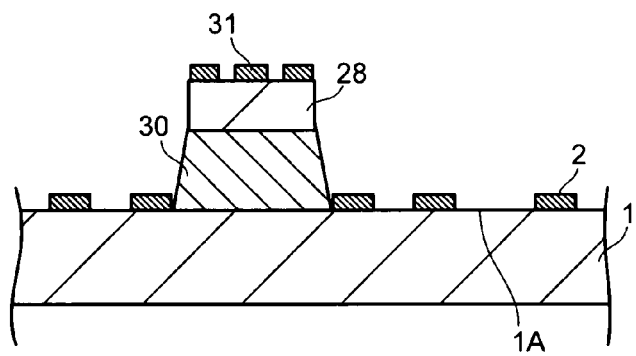

As shown in FIG. 14A, the electrode pads 2 are formed on the main surface 1A of the semiconductor wafer (electronic component) 1. As shown in FIG. 14B, then, the second electronic component 28 is formed above the semiconductor wafer 1 so that the functional surface of the second electronic component 28 is faced up (not faced to the semiconductor wafer 1). Electrode pads 31 are additionally formed on the functional surface of the second electronic component 28. The second electronic component 28 is mechanically connected with the semiconductor wafer 1 with the epoxy resin 30.

Figure 14C:
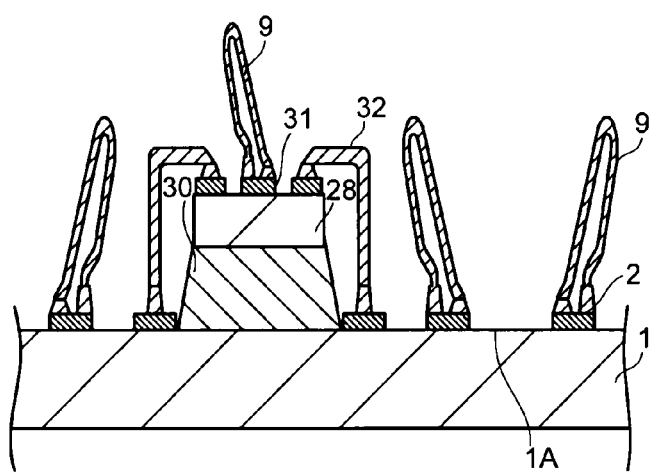

Then, as shown in FIG. 14C, the additional electrode pads 31 located at the edge of the second electronic component 28 are electrically connected with the electrode pads 2 located at both sides of the second electronic component 28 with additional bonding wires 32 so that the second electronic component 28 can be electrically connected with the semiconductor wafer 1 (electronic component) 1. Then, the bonding wires 9 are formed on the residual electrode pads 2 located outside the electrode pads 2 electrically connected with the additional electrode pads 2 so as to be elongated upward from the residual electrode pads 2 and shaped in loop, respectively. Then, the bonding wire 9 is also formed on the additional electrode pad 31 located at the center of the second electronic component 28 so as to be elongated upward from the residual electrode pads 2 and shaped in loop.

Figure 14D:
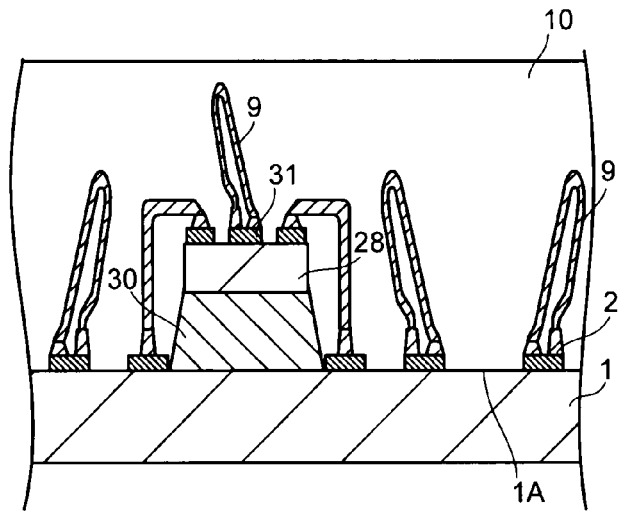

Then, as shown in FIG. 14D, the surface protective resin layer 10 is formed over the main surface 1A of the semiconductor wafer 1 so as to embed the bonding wires 9 and the second electronic component 28.

Figure 14E:
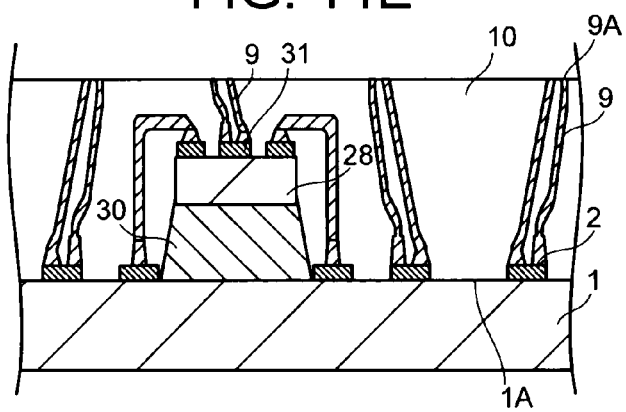

Then, after the surface protective resin layer 10 is hardened, as shown in FIG. 14E, the resin layer 10 is grinded at the surface level lower than the forefronts of the bonding wires 9 so as to expose the ends 9A of the bonding wires 9. In contrast, since the top surface of the second electronic component 28 is located sufficiently below the forefronts of the bonding wires 9, the top surface of the second electronic component can not be exposed from the resin layer 10.

Figure 14F:
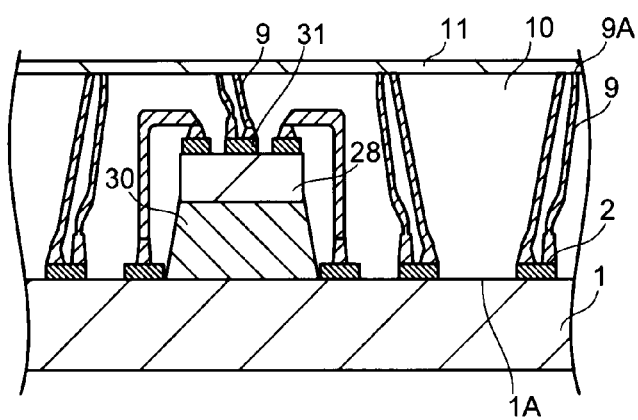
Figure 15A:
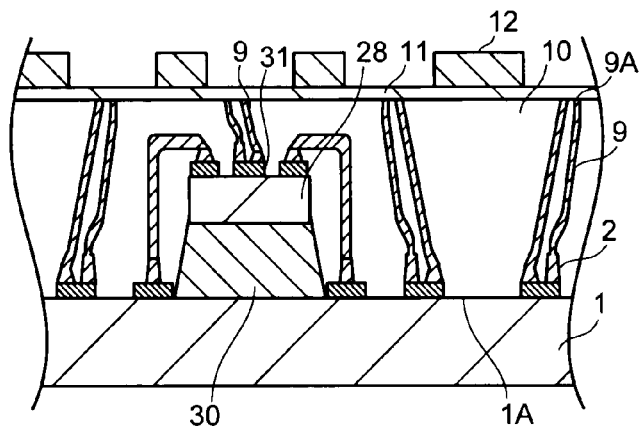
Figure 15B:
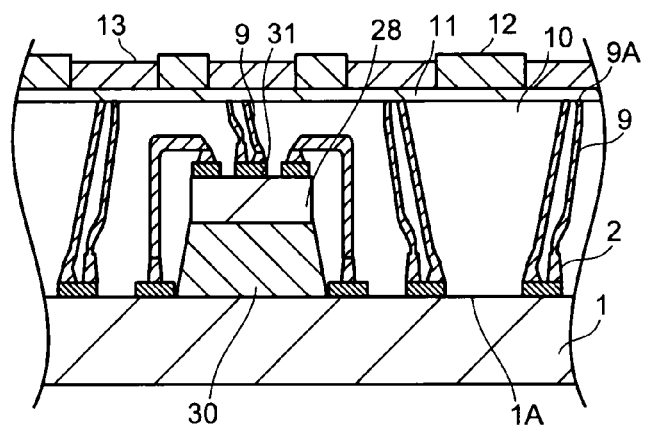
Figure 15C:
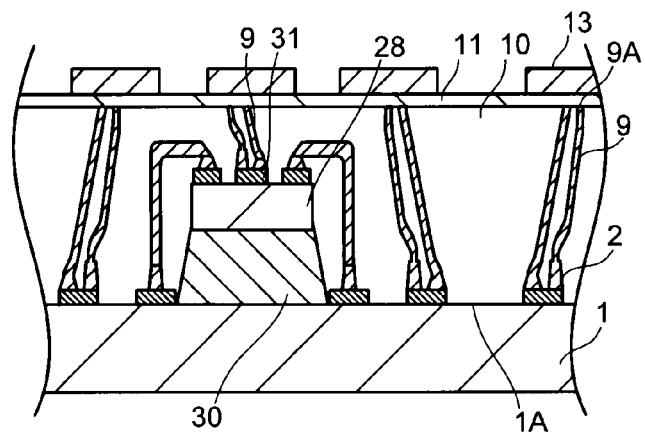
Figure 15D:
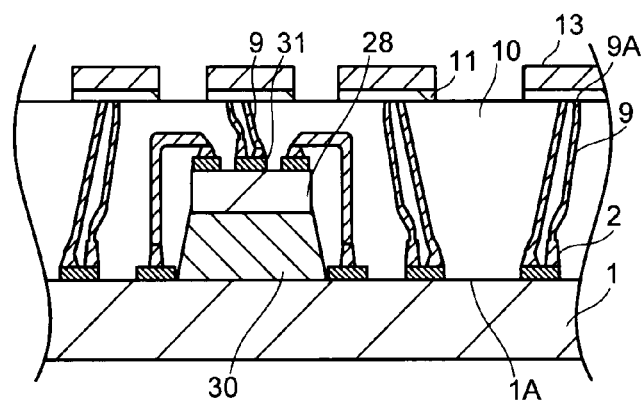

Then, as shown in FIG. 14F, the barrier metal 11 is formed over the grinded surface protective resin layer 10 and a resist layer is formed thick by spin coating. Then, as shown in FIG. 15A, the resist layer is opened at the areas containing the ends 9A of the bonding wires 9 so as to form the resist pattern 12. Then, as shown in FIG. 15B, the electrolyte copper plated films 13 (mounting pads) are formed by using the barrier metal 11 as a plating wire so as to embed the openings 12A of the resist pattern 12, and as shown in FIG. 15C, the resist pattern 12 is removed. Then, as shown in FIG. 15D, the barrier metal 11 is wet-etched by using the copper plated films 13 as a mask.

Figure 15E:
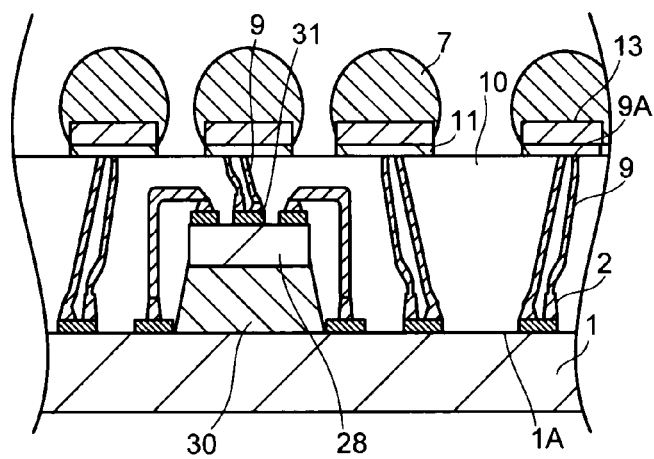
Figure 15F:
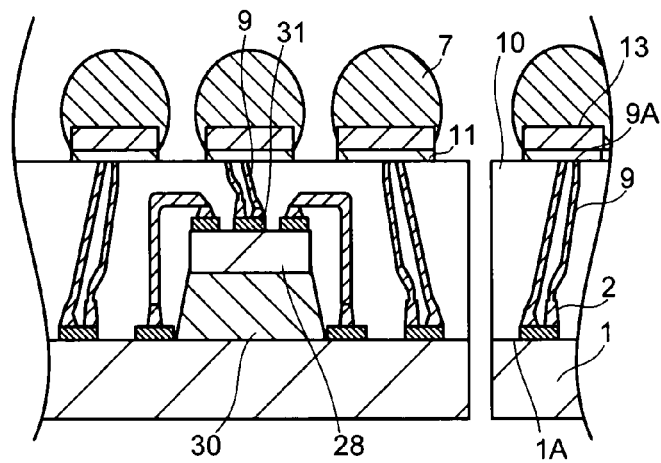

Then, as shown in FIG. 15E, the solder balls 7 are mounted on the copper plated films 13 and heated under reducing atmosphere or with a flux so as to be bonded with the copper plated films 13, thereby forming the mounting BGA terminals. Lastly, the thus obtained semiconductor assembly is divided by diamond blade so as to form wafer level CSPs or electronic component packages as shown in FIG. 15F.

In this embodiment, since the second electronic component 28 is mounted above the semiconductor wafer 1, the surface of the semiconductor assembly becomes bumpy as a whole. It is difficult, therefore, that a resist layer can not be formed uniformly on the semiconductor assembly by spin coating and a developing process can not be carried out under good condition so that the photolithography process can not be carried out under good condition. In this embodiment, since the electrode pads 2 of the semiconductor wafer (electronic component) 1 and the solder balls (mounting BGA terminals) 7 are directly connected with the bonding wires 9 under no photolithography, the above-described problems originated from the photolithography can not occur.

In this embodiment, since the bonding wire 9 can be formed on the second electronic component 28, the bonding wire 9 can be drawn out of the resin layer 10 so that the loop surface of the bonding wire 9 can be exposed from on the resin layer 10. Therefore, the length of a wiring pattern on the grinded resin layer 10 can be shortened or the wiring pattern on the grinded resin layer 10 can be omitted on the grinded resin layer 10.

Eighth Embodiment

FIGS. 16 to 18 relate to steps in a method for manufacturing an electronic component package according to an eighth embodiment. In this embodiment, the MEMS is provided on the semiconductor wafer and the second electronic component is provided under the face-up condition so as to sandwich the MEMS with the semiconductor wafer.

Figure 16A:
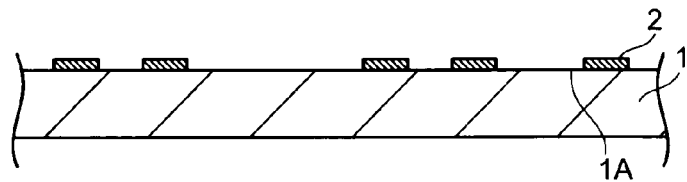
FIGS. 16 to 18 relates to steps in a method for manufacturing an electronic component package according to an eighth embodiment.
Figure 16B:
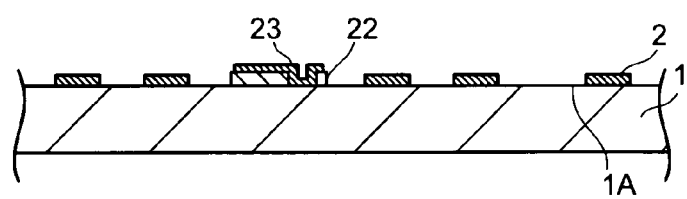
Figure 16C:
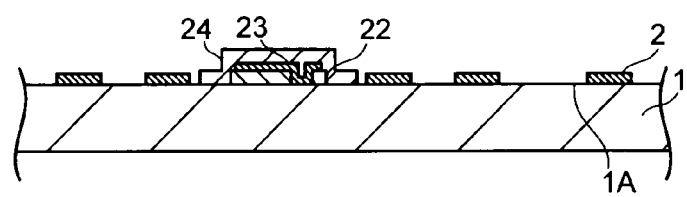
Figure 16D:
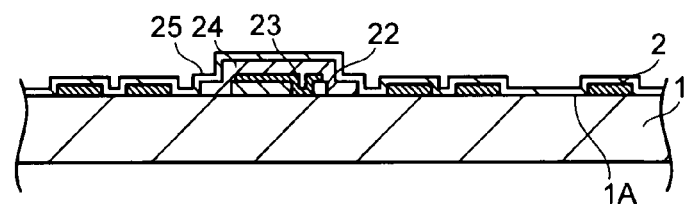

As shown in FIG. 16A, the electrode pads 2 are formed on the main surface 1A of the semiconductor wafer (electronic component) 1. As shown in FIG. 16B, then, the first sacrificial layer 22 is formed on the main surface 1A of the semiconductor wafer 1, and the movable part 23 of the MEMS is formed on the first sacrificial layer 22. As shown in FIG. 16C, then, the second sacrificial layer 24 is formed so as to cover the movable part 23. As shown in FIG. 16D, then, the cap layer 25 is formed over the main surface 1A of the semiconductor wafer 1 so as to cover the second sacrificial layer 24.

Figure 16E:
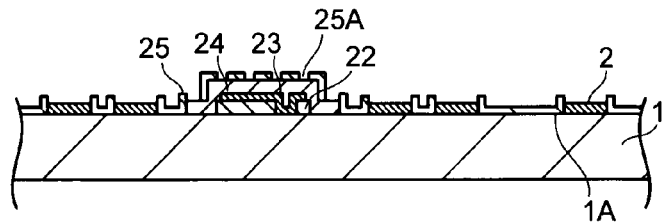
Figure 16F:
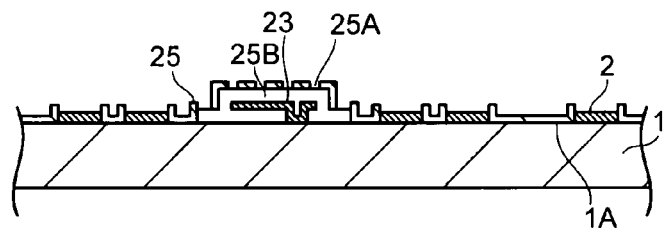
Figure 16G:
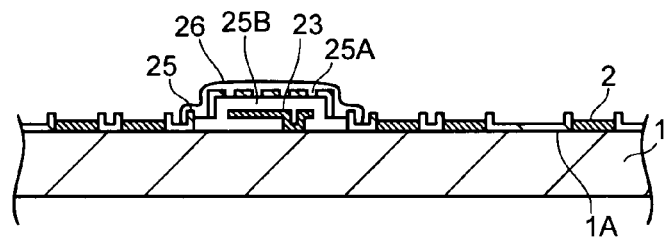
Figure 16H:
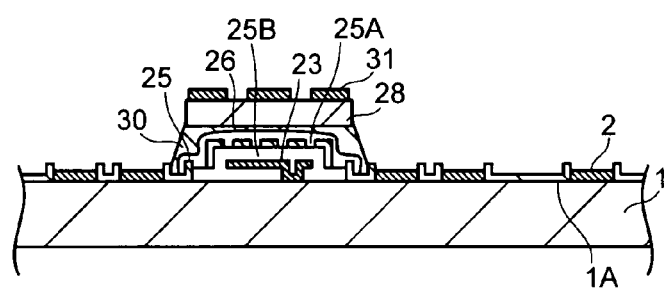

As shown in FIG. 16E, the openings 25A are formed at the cap layer 25 so as to partially expose the second sacrificial layer 24, and as shown in FIG. 16F, the first sacrificial layer 22 and the second sacrificial layer 24 are etched via the openings 25A, and thus, partially removed. As a result, the cavity 25B is formed so that the movable part 23 is disposed in the cavity 25B. Then, as shown in FIG. 16G, the resin layer 26 is formed so as to embed the openings 25A. Then, as shown in FIG. 16H, the second electronic component 28 is formed above the semiconductor wafer 1 via the epoxy resin 30 so that the functional surface of the second electronic component 28 is faced up (not faced to the semiconductor wafer 1). The additional electrode pads 31 are formed on the functional surface of the second electronic component 28.

Figure 17A:
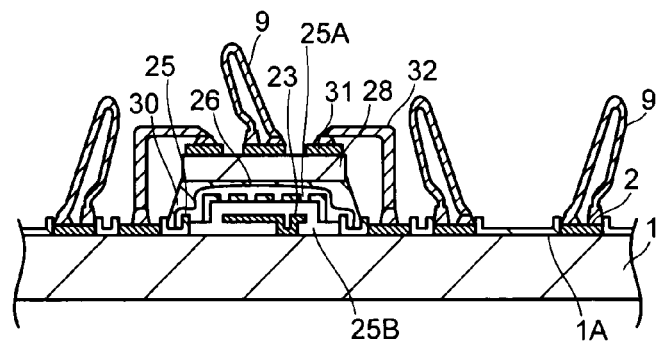

Then, as shown in FIG. 17A, the additional electrode pads 31 located at the edge of the second electronic component 28 are electrically connected with the electrode pads 2 located at both sides of the second electronic component 28 with the additional bonding wires 32 so that the second electronic component 28 can be electrically connected with the semiconductor wafer 1 (electronic component) 1. Then, the bonding wires 9 are formed on the residual electrode pads 2 located outside the electrode pads 2 electrically connected with the additional electrode pads 2 so as to be elongated upward from the residual electrode pads 2 and shaped in loop, respectively. Then, the bonding wire 9 is also formed on the additional electrode pad 31 located at the center of the second electronic component 28 so as to be elongated upward from the residual electrode pads 2 and shaped in loop.

Figure 17B:
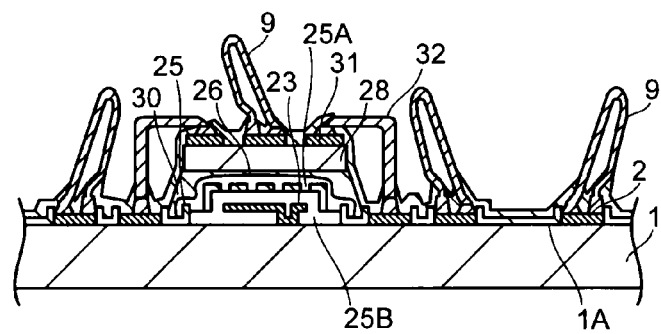

Then, as shown in FIG. 17B, the thus obtained wafer assembly is heated so as to dry the interior of the cavity 25B via the resin layer 26, and the inorganic insulating film 27 is formed over the wafer assembly by CVD or sputtering. In this case, the getter for absorbing moisture may be added in the resin layer 26 so that the heating process can be omitted or the heating temperature can be lowered and/or the heating period can be shortened.

Figure 17C:
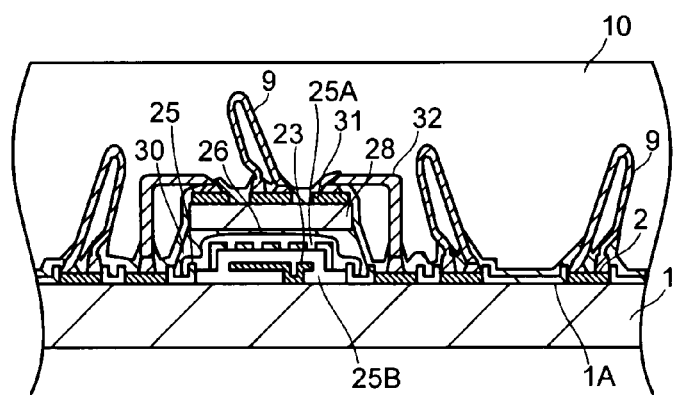

Then, as shown in FIG. 17C, the surface protective resin layer 10 is formed over the semiconductor assembly so as to embed the bonding wires 9, the movable part 23 of the MEMS and the second electronic component 28.

Figure 17D:
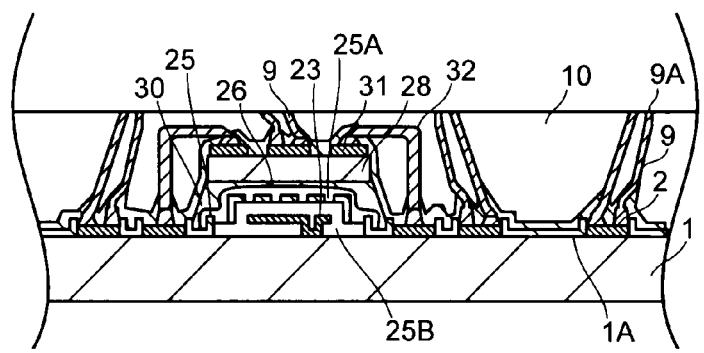

Then, after the surface protective resin layer 10 is hardened, as shown in FIG. 17D, the resin layer 10 is grinded at the surface level lower than the forefronts of the bonding wires 9 so as to expose the ends 9A of the bonding wires 9. In this case, since the forefronts of the loop-shaped bonding wires 9 are removed, two wires are elongated upward from one of the electrode pads 2. In contrast, since the top surface of the second electronic component 28 is located sufficiently below the forefronts of the bonding wires 9, the top surface of the second electronic component 28 can not be exposed from the resin layer 10.

Figure 17E:
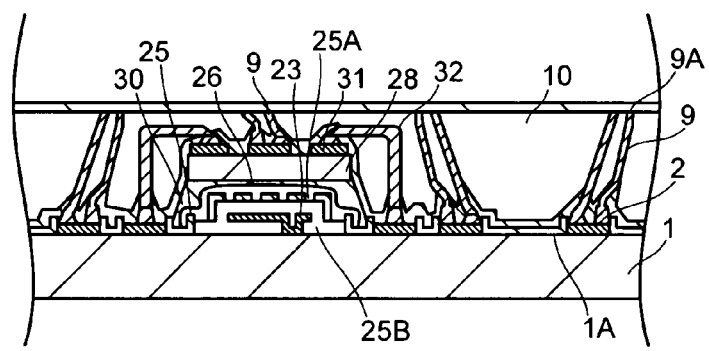
Figure 17F:
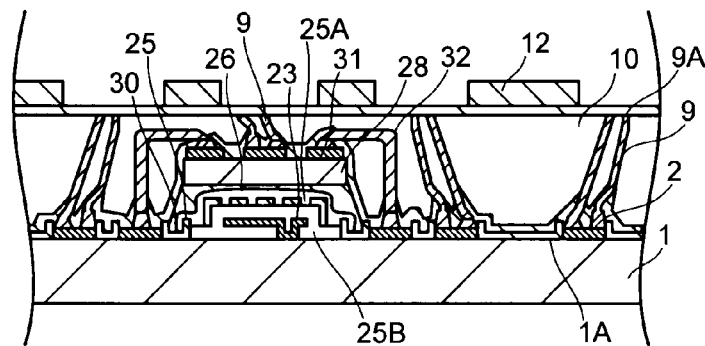
Figure 18A:
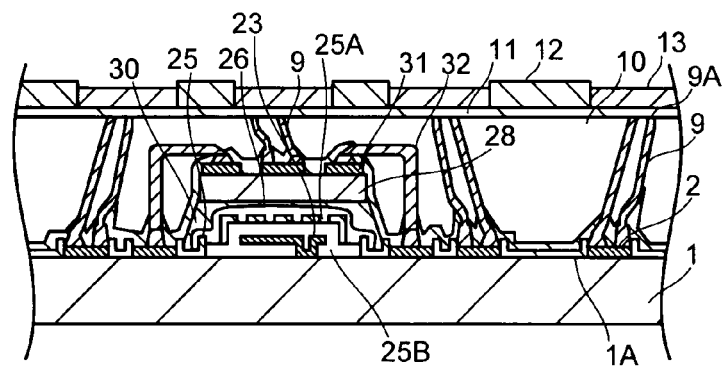
Figure 18B:
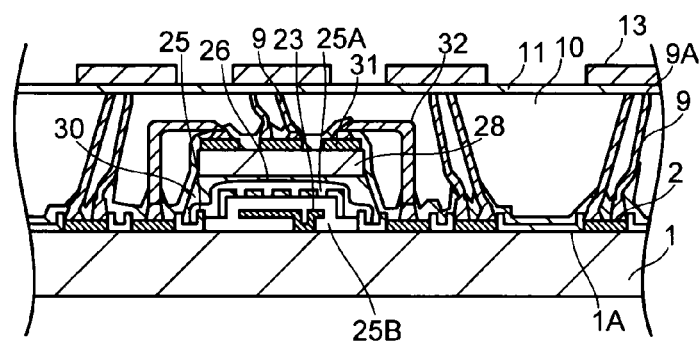
Figure 18C:
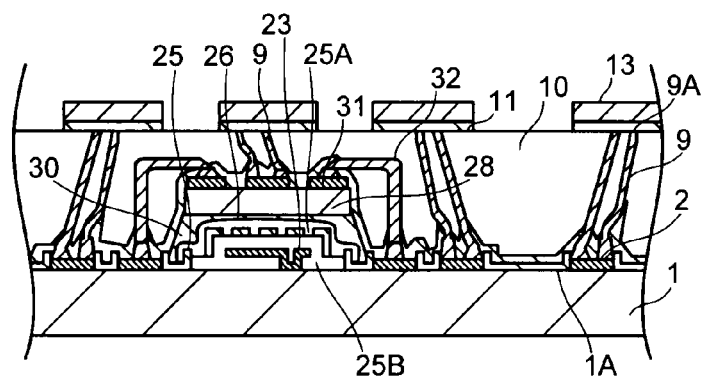

Then, as shown in FIG. 17E, the barrier metal 11 is formed over the grinded surface protective resin layer 10 and the resist layer is formed thick by spin coating. Then, as shown in FIG. 17F, the resist layer is opened at the areas containing the ends 9A of the bonding wires 9 so as to form the resist pattern 12. Then, as shown in FIG. 18A, the electrolyte copper plated films 13 (mounting pads) are formed by using the barrier metal 11 as a plating wire so as to embed the openings 12A of the resist pattern 12, and as shown in FIG. 18B, the resist pattern 12 is removed. Then, as shown in FIG. 18C, the barrier metal 11 is wet-etched by using the copper plated films 13 as a mask.

Figure 18D:
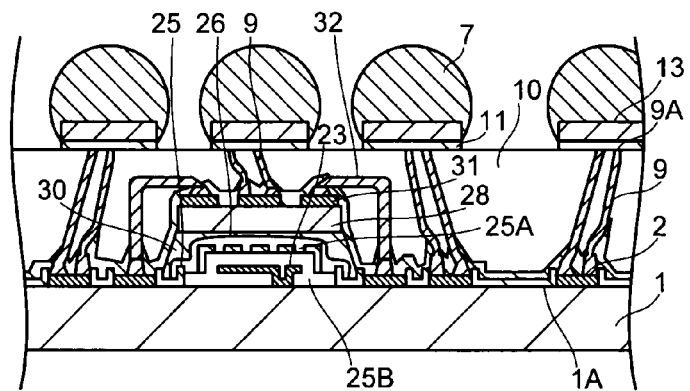
Figure 18E:
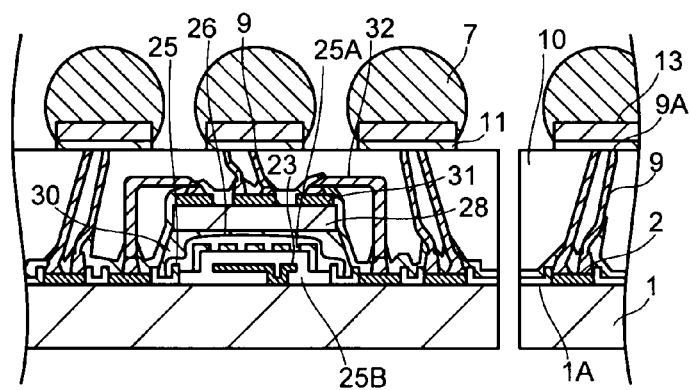

Then, as shown in FIG. 18D, the solder balls 7 are mounted on the copper plated films 13 and heated under reducing atmosphere or with a flux so as to be bonded with the copper plated films 13, thereby forming the mounting BGA terminals. Lastly, the thus obtained semiconductor assembly is divided by diamond blade so as to form wafer level CSPs or electronic component packages as shown in FIG. 18E.

In this embodiment, since the movable part 23 of the MEMS is mounted on the semiconductor wafer 1 and the second electronic component 28 is mounted above the semiconductor wafer 1, the surface of the semiconductor assembly becomes bumpy as a whole. It is difficult, therefore, that a resist layer can not be formed uniformly on the semiconductor assembly by spin coating and a developing process can not be carried out under good condition so that the photolithography process can not be carried out under good condition. In this embodiment, since the electrode pads 2 of the semiconductor wafer (electronic component) 1 and the solder balls (mounting BGA terminals) 7 are directly connected with the bonding wires 9 under no photolithography, the above-described problems originated from the photolithography can not occur.

In this embodiment, moreover, the movable part 23 of the MEMS is disposed in the cavity 25B, but a cap may be formed on the movable part 23. Then, the movable part 23 may be embedded into the semiconductor wafer 1 and covered with a plane film.

Although the present invention was described in detail with reference to the above examples, this invention is not limited to the above disclosure and every kind of variation and modification may be made without departing from the scope of the present invention.

The number of the bonding wire 9 is not restricted only if the semiconductor wafer 1 is electrically connected with the barrier metal 11. Namely, the number of the bonding wire 9 may be set to one or two as described in the embodiments, but may be set to three or more.

In the embodiments, the bonding wires 9 are partially removed by grinding and thus, divided as shown in FIG. 1D, for example. However, the bonding wires 9 may be grinded so as not to be divided by stopping the grinding process when the top ends of the bonding wires 9 are exposed.

Moreover, a solder plated layer may be formed on the electrolyte copper plated films, and then, melted and spheroidized. The copper films may be formed by sputtering instead of the electrolyte copper plating. Alternatively, gold or palladium films may be formed on the electrolyte copper plated films instead of the solder balls. Then, the electrolyte copper plated films may be omitted if the barrier metal 11 is made of a thick nickel film so as to barrier between the solder balls and the bonding wires.

In the embodiments, a resin layer may be formed on the rear surface of the semiconductor wafer 1 in the same manner as the surface protective resin layer. In this case, the stress from the surface resin layer to the semiconductor wafer can be balanced with the stress from the rear resin layer to the semiconductor wafer so as to reduce the warpage of the semiconductor wafer 1. The rear resin layer may be made of a resin with a thermal expansion coefficient larger than the thermal expansion coefficient of the resin making the surface resin layer.

In the embodiments, the electrolyte copper plated films are formed via the thick and patterned resist layer, but an electrolyte copper film may be formed uniformly over the barrier metal and patterned with the barrier metal through etching to form the electrolyte copper plated films. In the latter case, however, it becomes difficult to recognize the alignment mark.

After the surface protective resin layer is grinded, a photosensitive polyimide may be formed and patterned on the grinded resin layer. Then, the barrier metal and the electrolyte copper plated film are formed over the patterned photosensitive polyimide so as to embed the openings thereof and grinded so that the top surface of the electrolyte copper plated film can be exposed. In this case, the mounting electrode pads can be formed of the copper portions remaining in the openings of the patterned photosensitive polyimide. A solder resist may be formed on the surface protective resin layer after the barrier metal is edged and before the solder balls are formed. In this case, the copper plated film to be formed is not required to be patterned as designed, and thus, the redistribution process may be carried out.

Then, a multilayered wiring may be formed on the surface protective resin layer. Since the surface of the resin layer is flattened through grinding, the productivity of the multilayered wiring using photolithography and the like becomes better.

In the embodiments, two electronic components are prepared and stacked, but three or more electronic components may be prepared and stacked. Moreover, in the case that the movable part of the MEMS is disposed in the cavity, the inorganic insulating film is formed by CVD or sputtering, but another dense insulating film may be formed instead of the inorganic insulating film. For example, a parylene film may be formed by MVD.

What is claimed is:

1. A method for manufacturing an electronic component package, comprising:
   forming electrode pads on a main surface of a first electronic component;
   forming first bonding wires shaped in loop so as to be electrically connected with the electrode pads and elongated upward from the electrode pads and such that both ends of the first bonding wires are on the electrode pad, respectively;
   forming a resin layer over the main surface of the first electronic component so as to embed the first bonding wires;
   removing a part of the resin layer so as to expose ends of the first bonding wires from the resin layer and removing the end of each of the first bonding wires so that two wires are elongated from on each of the electrode pads; and
   forming a metallic layer on the surface of the resin layer after removing the part of the resin layer so that the first bonding wires are electrically connected with the metallic layer.

2. The method as set forth in claim 1,
   wherein the first bonding wires are shaped in loop by drawing up one end of a wire to a predetermined height under the condition that the other end of the wire is fixed onto one of the electrode pads, moving the wire laterally so that a midpoint of the wire can be bended, drawing up the one end of the wire so that a length of the wire can be formed as a loop, winding the wire around a point in arc, moving and connecting the wire onto the one of the electrode pads.

3. The method as set forth in claim 1, further comprising:
   forming a movable part of a MEMS on the main surface of the first electronic component via a first sacrificial layer;
   forming a second sacrificial layer so as to cover the movable part of the MEMS;
   forming a cap layer on the main surface of the first electronic component so as to cover the first sacrificial layer and the second sacrificial layer;
   forming an opening at the cap layer on the first sacrificial layer and the second sacrificial layer so that at least a portion of the first sacrificial layer and the second sacrificial layer can be exposed;
   etching and removing the first sacrificial layer and the second sacrificial layer via the opening; and
   forming an additional resin layer so as to embed the opening,
   wherein the movable part of the MEMS is embedded by the resin layer.

4. The method as set forth in claim 1, further comprising mounting a second electronic component on the main surface of the first electronic component via a second resin layer, the second electronic component being electrically connected with the first electronic component, wherein the second electronic component is embedded by the second resin layer.

5. The method as set forth in claim 3, further comprising mounting a second electronic component above the movable part of the MEMS via second resin layer, the second electronic component being electrically connected with the first electronic component,
wherein the second electronic component is embedded by the resin layer.

6. The method as set forth in claim 4, wherein the second electronic component is provided in face-up, and an additional electrode pad is formed on a top side of the second electronic component, and a loop-shaped second bonding wire is formed to be elongated upward from the additional electrode pad so that an end of the second bonding wire is removed by polishing a surface of the resin layer in such a manner that two wires are elongated upward from the additional electrode pad.

7. The method as set forth in claim 4,
wherein at least one of the electrode pads formed on the main surface of the first electronic component is electrically connected with the additional electrode pad formed on the top side of the second electronic component via a third bonding wire.

8. A method for manufacturing an electronic component package, comprising:
forming electrode pads on a main surface of a first electronic component;
forming first bonding wires shaped in loop and elongated upward by bridging each of the first bonding wires between ones of the electrode pads;
forming a resin layer over the main surface of the first electronic component so as to embed the first bonding wires;
removing a part of the resin layer so as to expose ends of the first bonding wires from the resin layer and removing the end of each of the first bonding wires so that one wire can be elongated from on each of the electrode pads; and
forming and patterning a metallic layer on the surface of the resin layer after removing the part of the resin layer, the surface of the resin layer containing a top of the one wire, so that the first bonding wires are electrically connected with the metallic layer.

9. The method as set forth in claim 8,
wherein each of the first bonding wires is shaped in loop by drawing up one end of a wire to a predetermined height under the condition that the other end of the wire is fixed onto one of the electrode pads, moving the wire laterally so that a midpoint of the wire can be bended, drawing up the one end of the wire so that a length of the wire can be formed as a loop, winding the wire around a point in arc, moving and connecting the wire onto an adjacent one of the electrode pads.

10. The method as set forth in claim 8, further comprising:
forming a movable part of a MEMS on the main surface of the first electronic component via a first sacrificial layer;
forming a second sacrificial layer so as to cover the movable part of the MEMS;
forming a cap layer uniformly on the main surface of the first electronic component so as to cover the first sacrificial layer and the second sacrificial layer;
forming an opening at the cap layer on the first sacrificial layer and the second sacrificial layer so that at least a portion of the first sacrificial layer and the second sacrificial layer can be exposed;
etching and removing the first sacrificial layer and the second sacrificial layer via the opening; and
forming an additional resin layer so as to embed the opening,
wherein the movable part of the MEMS is embedded by the resin layer.

11. The method as set forth in claim 8, further comprising mounting a second electronic component on the main surface of the first electronic component via second resin layer, the second electronic component being electrically connected with the first electronic component,
wherein the second electronic component is embedded by the second resin layer.

12. The method as set forth in claim 10, further comprising mounting a second electronic component above the movable part of the MEMS via a second resin layer, the second electronic component being electrically connected with the first electronic component,
wherein the second electronic component is embedded by the resin layer.

13. The method as set forth in claim 11,
wherein the second electronic component is provided in face-up, and additional electrode pads are formed on a top side of the second electronic component, and a loop-shaped second bonding wire is formed to be elongated upward from the additional electrode pad and to be bridged between the additional electrode pads so that an end of the second bonding wire is removed by grinding a surface of the resin layer in such a manner that one wire is elongated upward from each of the additional electrode pads.

14. The method as set forth in claim 13,
wherein at least one of the electrode pads formed on the main surface of the first electronic component is electrically connected with the additional electrode pad formed on the top side of the second electronic component via a third bonding wire.

\* \* \* \* \*